(12) United States Patent
Kim et al.

(10) Patent No.: US 6,677,520 B1
(45) Date of Patent: Jan. 13, 2004

(54) FANNING TRAY

(75) Inventors: Matthew Kim, Minneapolis, MN (US); Michael J. Wentworth, Belle Plaine, MN (US); Trevor D. Smith, St. Louis Park, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 10/201,623

(22) Filed: Jul. 22, 2002

(51) Int. Cl.[7] ................................................. H05K 5/00
(52) U.S. Cl. ........................ 174/50; 370/216; 370/331; 370/225; 206/211; 439/668; 439/188; 439/944; 359/118; 359/137; 211/4; 385/135
(58) Field of Search ............................ 174/50; 206/211; 370/216, 331, 225; 439/668, 188, 944; 359/118, 137; 211/4; 385/135

(56) References Cited

U.S. PATENT DOCUMENTS

| | | | | |
|---|---|---|---|---|
| 3,660,613 A | * | 5/1972 | Mullin et al. | 379/326 |
| 4,594,044 A | * | 6/1986 | Soot | 414/263 |
| 5,640,482 A | * | 6/1997 | Barry et al. | 385/135 |
| 5,659,655 A | * | 8/1997 | Pilatos | 385/136 |
| 5,758,003 A | * | 5/1998 | Wheeler et al. | 385/134 |
| 5,885,112 A | * | 3/1999 | Louwagie et al. | 439/719 |
| 6,245,998 B1 | * | 6/2001 | Curry et al. | 174/72 A |
| 6,438,310 B1 | | 8/2002 | Lance et al. | 385/135 |
| 6,504,988 B1 | | 1/2003 | Trebesch et al. | 385/135 |

FOREIGN PATENT DOCUMENTS

WO    WO 02/19005 A2    3/2002    ................. 385/135

* cited by examiner

Primary Examiner—Dean A. Reichard
Assistant Examiner—Anton Harris
(74) Attorney, Agent, or Firm—Merchant & Gould P.C.

(57) ABSTRACT

A telecommunications cable management system includes fanning trays and management panels, including slidable drawers, mounted to a rack for management of cables. The fanning tray includes fingers for managing vertical cables. The cables extend horizontally through the fanning tray. The fanning tray includes hinges to access the space or the rack behind the fanning tray. A lock holds the fanning tray in the pivoted up position. One drawer includes slack management devices including a radius limiter that selectively releases to release slack at desired times. A slidable termination panel can be mounted in another drawer to allow greater access to the panel. The fanning trays and drawers are mounted to a rack for managing and connecting the cables.

9 Claims, 25 Drawing Sheets

FANNING TRAY

FIELD OF THE INVENTION

The present invention relates to cable management devices and methods for telecommunications cables.

BACKGROUND OF THE INVENTION

In telecommunications infrastructure installations, equipment for switching, cross-connecting and inter-connecting a variety of devices are used. Much of these devices are installed in telecommunications equipment racks to permit organized, high-density installations to be achieved in limited space available for equipment. Due to the increasing demand for telecommunications system capacity, it is desirable to increase the density of connections within a given space that can be achieved. Commensurate with the demand for increased capacity from the same installation footprint is a desire to improve the organization and handling of the cables used to link the equipment within the installation and the outside plant and facilities cables.

One approach to increasing system capacity within an installation is the use of higher speed, higher capacity telecommunications cables, whether copper or optical fiber. These higher speed, higher capacity cables require that more strict minimum bend radius protections are in place to maintain data flow. Improvements to the ability of the equipment within a telecommunications installation to provide bend radius protection are desirable.

SUMMARY OF THE INVENTION

The present invention concerns cable management devices and methods. In one preferred embodiment, the devices are mounted to a rack for managing cables extending to and from equipment on the rack. Equipment is mounted to the rack and extends across the width of the rack. Cables from the equipment extend vertically downwardly in one preferred embodiment. A fanning tray directs the vertical cables to one or more vertical cable guides. The rack includes cable slack management devices. The rack also includes termination locations for terminating the cables and for connecting the cables to other cables. In one preferred embodiment, cable slack storage locations and the termination locations are located in slideable drawers.

The present invention relates to an optical fiber cable management panel including a drawer assembly including a chassis and a drawer wherein the drawer is slidably mounted within the chassis. The drawer assembly defines a storage interior and a first cable access entry to permit optical fiber cable to enter into the storage interior. A cable radius limiter is slidably mounted relative to the drawer assembly. A releasable lock allows selective release of the cable radius limiter for releasing slack at a desired time. The preferred drawer assembly can be mounted to a rack with other drawers or other equipment. The preferred drawer assembly also includes a second cable radius limiter which moves in a synchronized manner with the drawer to manage cables at the first cable access entry point.

The present invention also relates to an optical fiber cable management panel including a drawer assembly including a chassis and a drawer wherein the drawer is slidably mounted within the chassis. The drawer assembly defines a storage interior and a first cable access entry to permit optical fiber cable to enter into the storage interior. A slidable termination panel is positioned within the storage interior. This slidable panel slides vertically when the drawer is positioned out of the chassis. Slidable mounts mount the panel and include two slide mechanisms on opposite ends of the panel. The preferred mounts include locks for retaining the panel in the closed, or down position. The preferred drawer assembly can be mounted to a rack with other drawers or other equipment. The preferred drawer assembly also includes a cable radius limiter which moves in a synchronized manner with the drawer to manage cables at the first cable access entry point.

The present invention further relates to a fanning tray for receiving cables extending in a vertical direction. The fanning tray directs cables from the vertical direction to the horizontal direction. The fanning tray can be mounted on a rack for receiving cables extending downwardly from equipment mounted on the rack above the fanning tray. Cables can be extended horizontally through the fanning tray toward side exits and vertical cable guides for directing the cables to other locations on the rack, or to other racks.

One preferred fanning tray includes hinges for hingedly mounting to the rack to allow access to the area behind the fanning tray on the rack. In the preferred embodiment, the fanning tray is used in combination with an optical fiber cable management panel including a slidably mounted cable radius limiter. A releasable lock allows selective movement of the cable radius limiter. The cable radius limiter can be used to take up slack. When slack is desired, such as when it is desired to rotate the fanning tray upwardly about the hinges, the releasable lock is released allowing release of the slack. Upon completion of the task requiring slack, such as accessing the area behind the lifted up fanning tray, the cable radius limiter is slidably moved and relocked into position to take up the slack.

One preferred embodiment of the fanning tray includes a hinge lock for locking the fanning tray in rotated up position. The lock of the fanning tray is activated and deactivated by the user. In the preferred embodiment, the lock includes a sliding lock tab.

Another preferred embodiment of the fanning tray includes a removable front cover. A horizontal tray within the fanning tray manages the cables extending toward the side exits. Radius limiters can be provided for the cables extending out the side exits and in a downward direction.

A variety of advantages of the invention will be set forth in part in the detailed description that follows and in part will be apparent from the description, or may be learned by practicing the invention. It is understood that both the foregoing general description and the following detailed description are explanatory only and are not restrictive of the invention as claimed.

BRIEF DESCRIPTION OF THE DRAWINGS

The accompanying drawings, which are incorporated in and constitute a part of the specification, illustrate several aspects of the invention and together with the description, serve to explain the principles of the invention. A brief description of the drawings is as follows.

DETAILED DESCRIPTION

Reference will now be made in detail to the exemplary aspects of the present invention that are illustrated in the accompanying drawings. Wherever possible, the same reference numbers will be used throughout the drawings to refer to the same or like parts.

Figure 1:
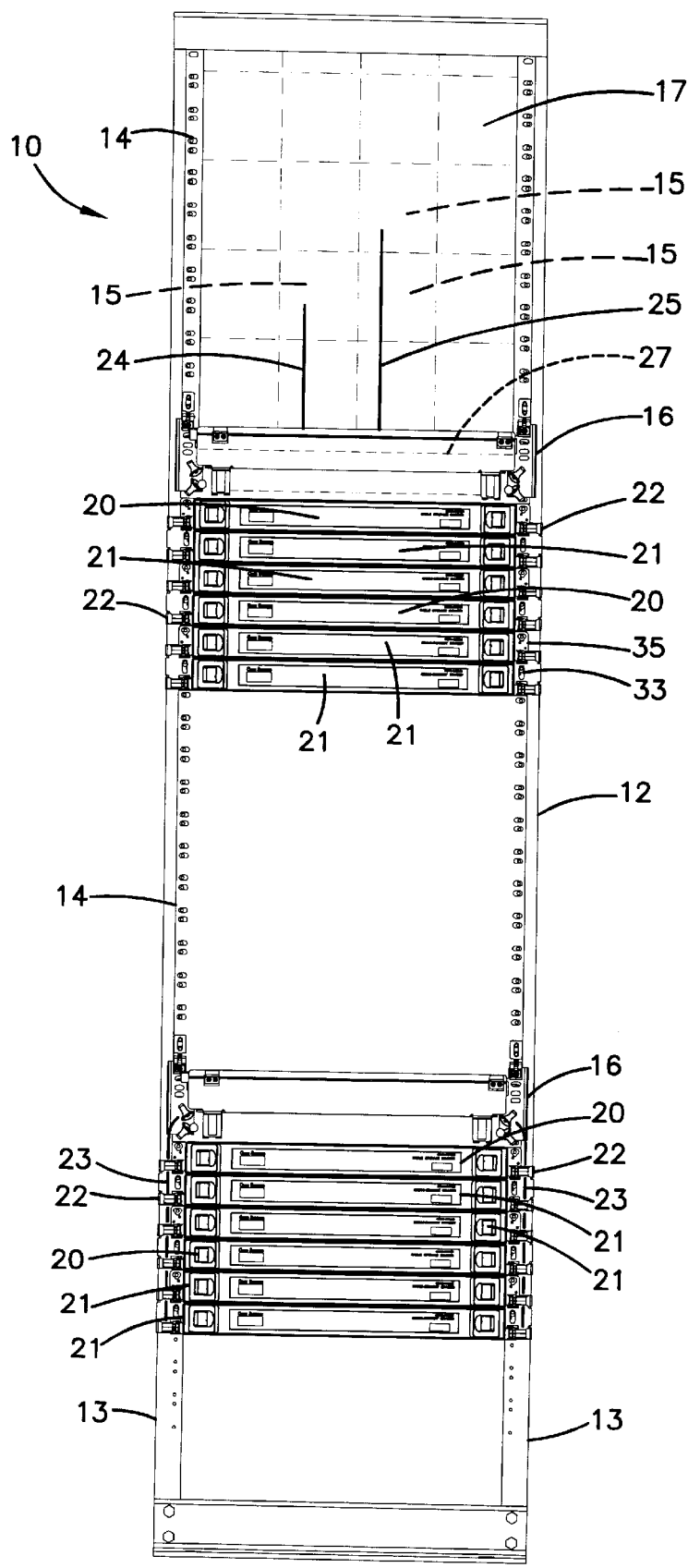
FIG. 1 is a front view of a first embodiment of a telecommunications system including an equipment rack in accordance with the present invention.

Referring now to FIG. 1, a telecommunications system 10 is shown including an upright rack 12 with two posts 13 for holding various pieces of telecommunications equipment and cable management devices. In system 10, telecommunications equipment 14, such as in-line cards 15 behind a cover 17 mounted to rack 12 are linked to other equipment. Fanning tray 16 assists with management of the cabling between equipment 14 and other equipment such as panels 20 and 21 defining sliding drawers. Other equipment can include cable storage, or termination or patch panels to cross-connect the equipment 14, or to inter-connect or cross-connect to other equipment in an adjacent rack or at a remote location. As will be described below, first panels 20 assist with management and storage of the cables connected to equipment 14. Second panels 21 allow for patching of the cables to each other or to other cables. Vertical cable guides 22 further assist with cable management.

Figure 2:
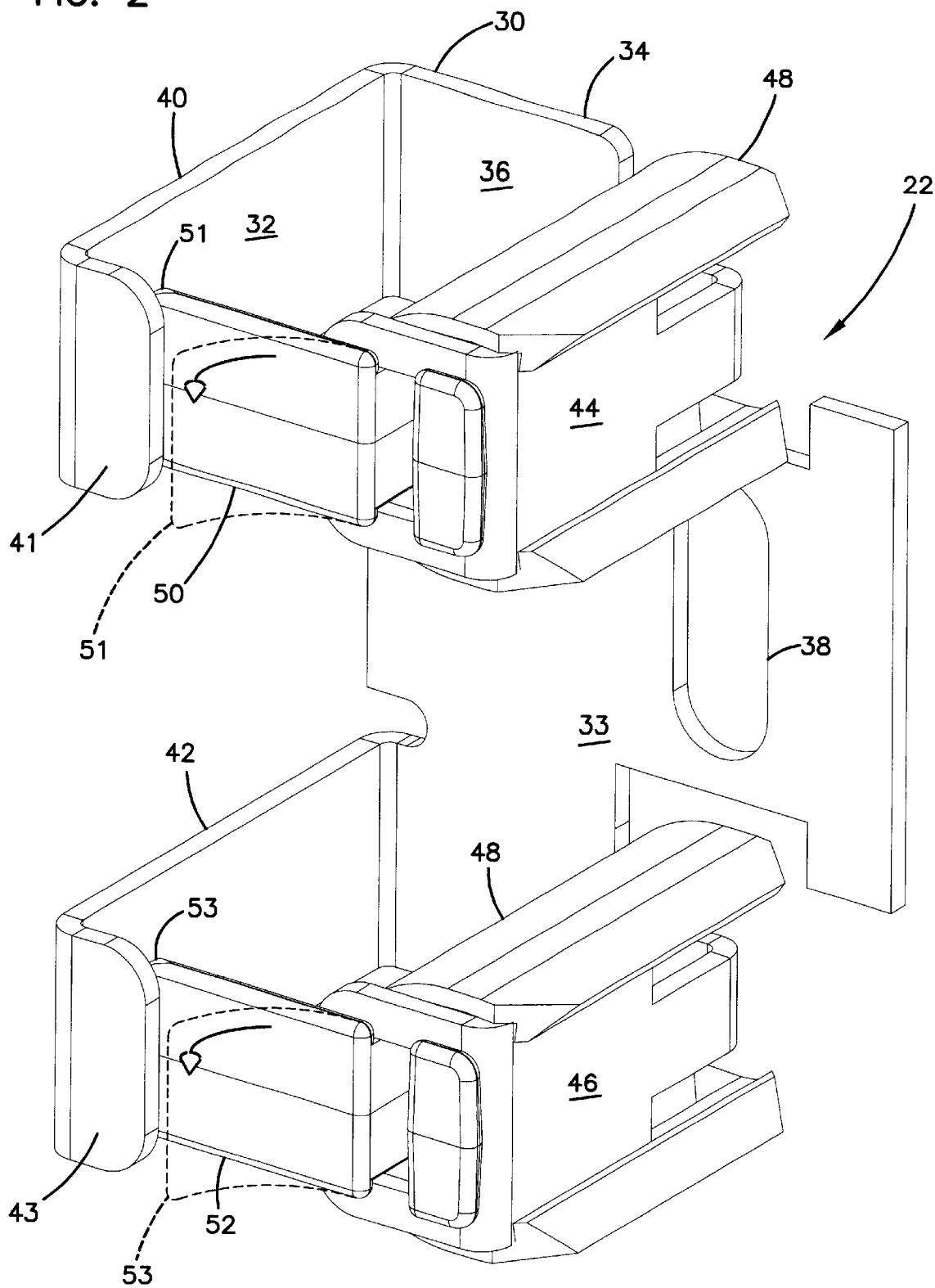
FIG. 2 is a front perspective view of one of the vertical cable guides from the system of FIG. 1.
Figure 3:
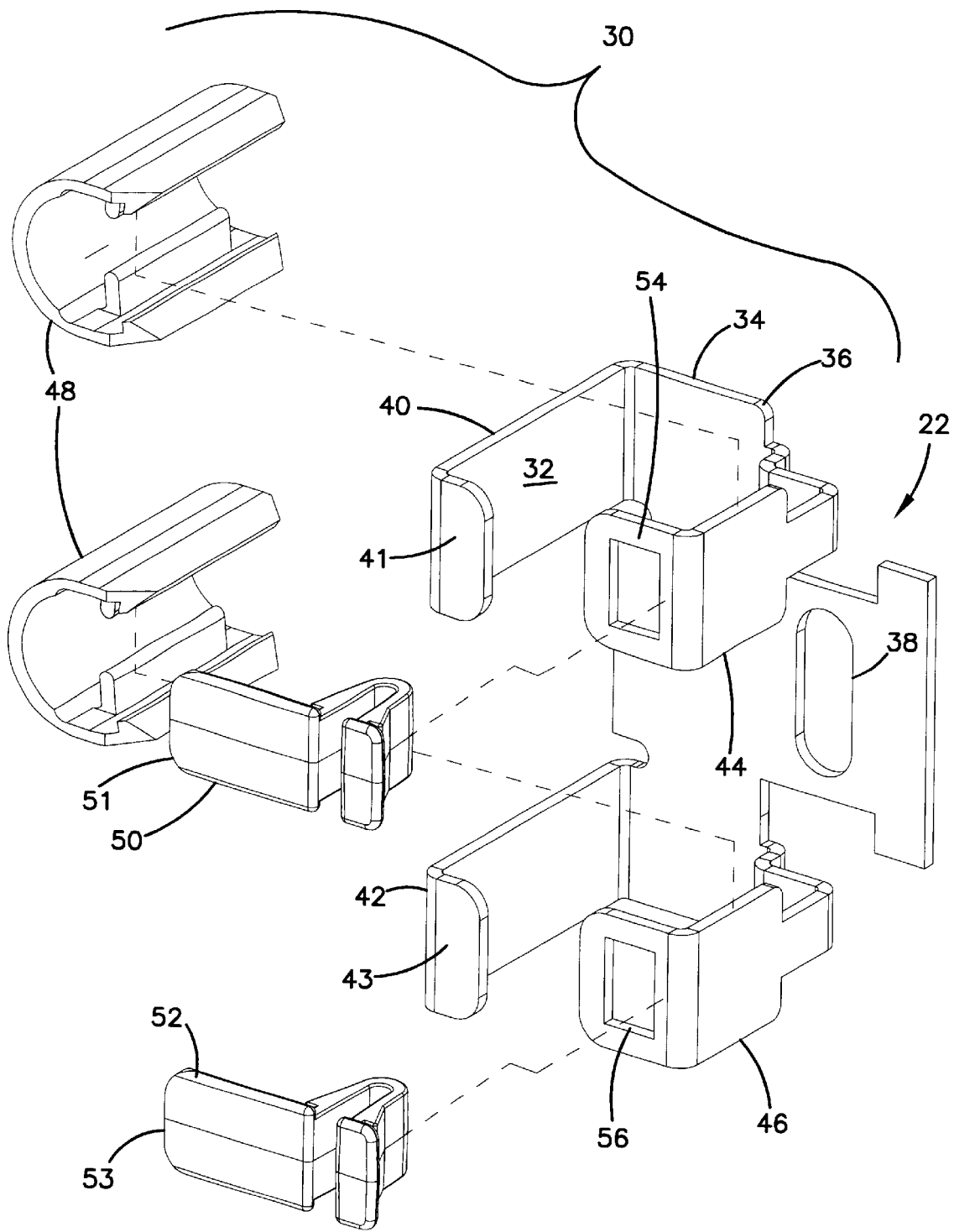
FIG. 3 is a front exploded perspective view of the vertical cable guide of FIG. 2.
Figure 4:
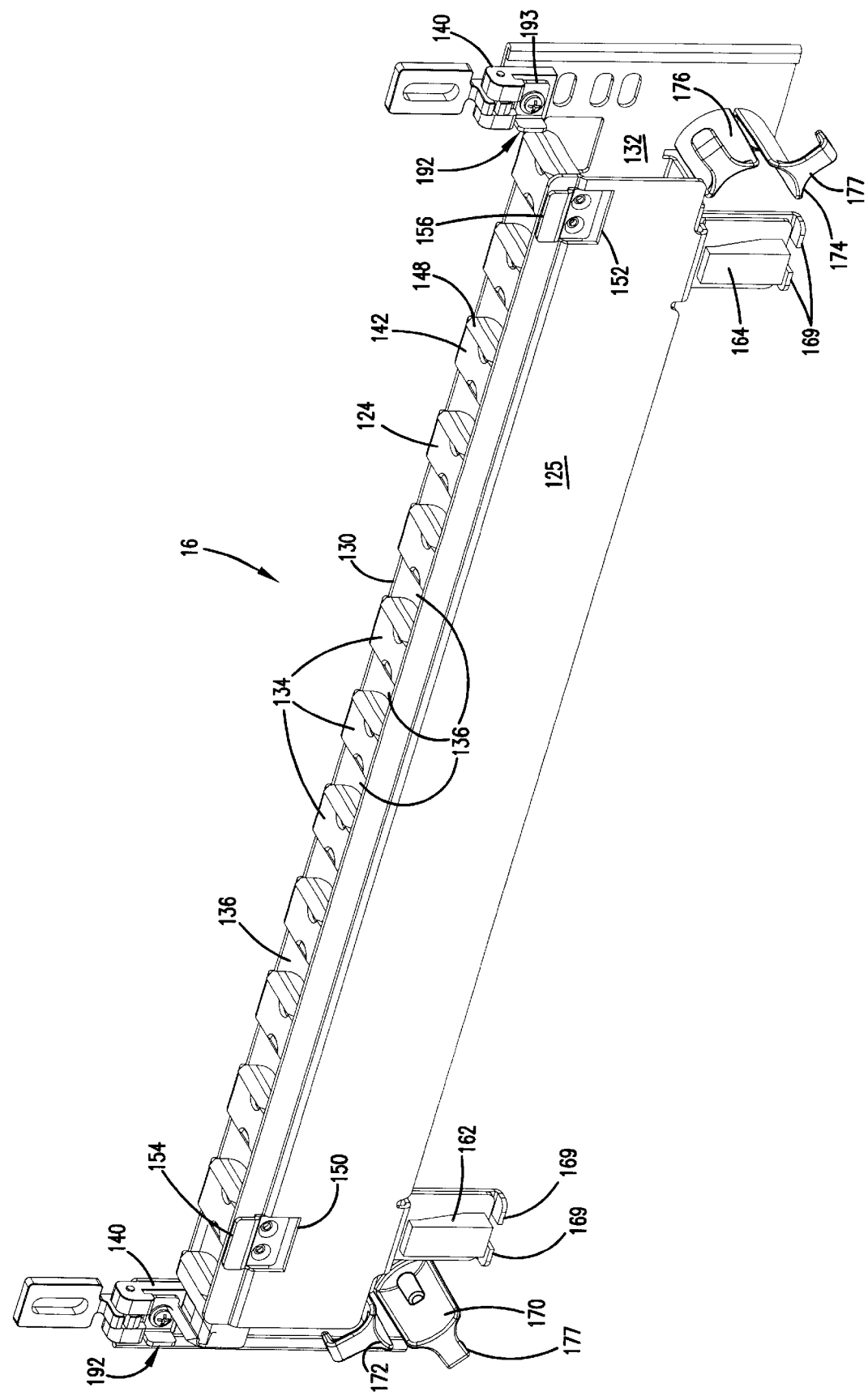
FIG. 4 is a front perspective view of the fanning tray of the system of FIG. 1.
Figure 5:
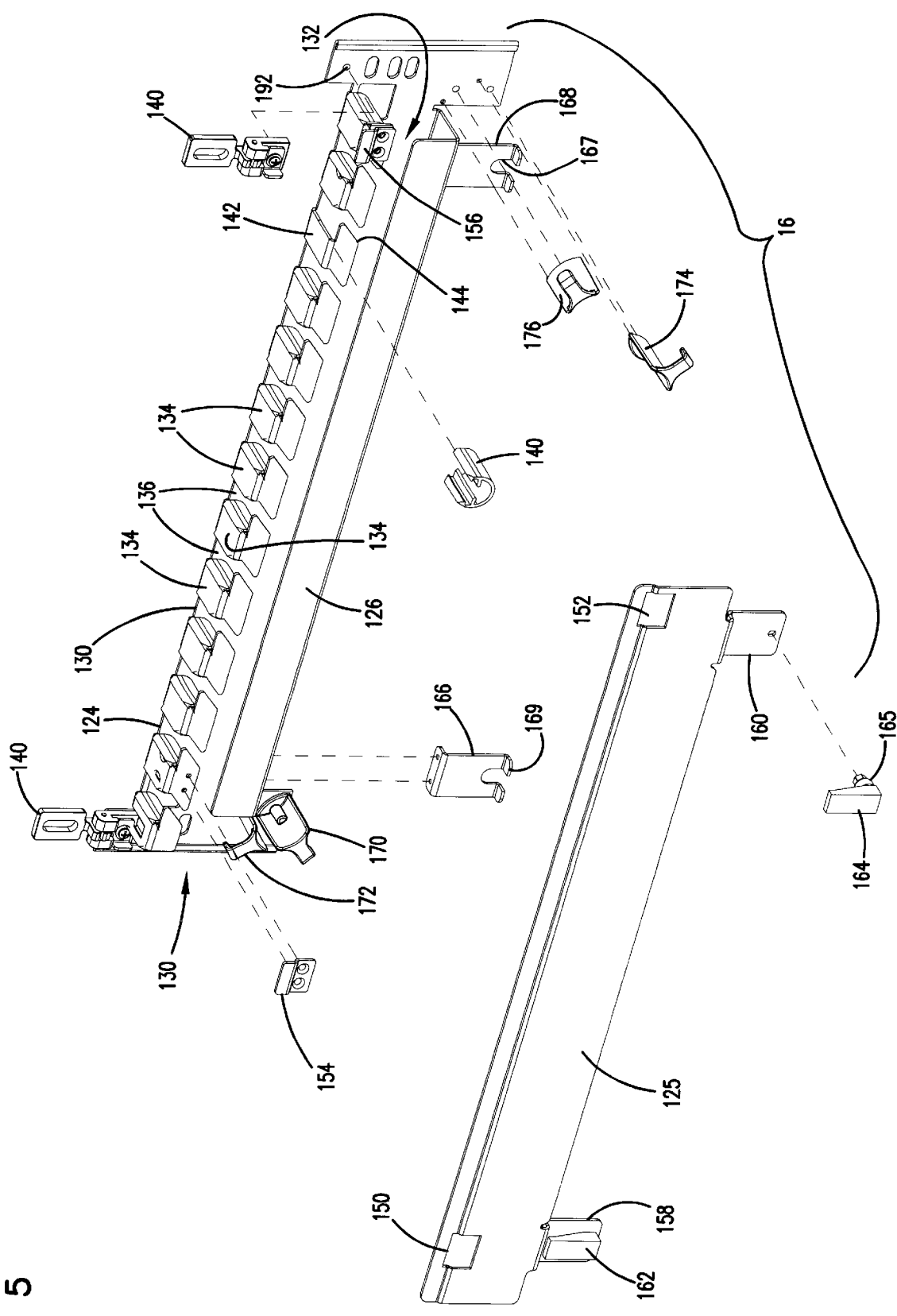
FIG. 5 is a perspective view of the fanning tray of FIG. 4 with the front cover removed, and various other elements shown exploded from a remainder of the device.

With reference to FIGS. 1–3, vertical cable guides 22 define vertical cable pathways 23 on rack 12. Vertical cable guides 22 in the preferred embodiment are comprised of individual elements or guides 30 which define a vertical channel 32 extending along rack 12 in the desired locations for cable management. Guides 30 each include a main body 34 with a base 36 defining a fastener hole 38 for mounting to rack 12 with a fastener. First and second arms 40, 42 on one side of base 36 cooperate with third and fourth arms 44, 46 on an opposite side of base 36 to define vertical channel 32. Arms 40, 42 each include a finger 41, 43 facing base 36, and extending toward third and fourth arms 44, 46.

Bend radius limiters 48 snap onto third and fourth arms 44, 46 to provide cable bend radius protection for cable guides 22. First and second tabs 50, 52 snap mount to apertures 54, 56 in third and fourth arms to further provide an enclosed area for holding cables in vertical channel 32. Tabs 50, 52 are made from flexible material such as molded polyethylene propylene. Ends 51, 53 can be flexed outside of fingers 41, 43 to allow cables to be inserted or removed from channel 32. Tabs 50, 52 are flexed outwardly as shown in FIG. 2. Tabs 50, 52 are flexed back inwardly behind fingers 41, 43 to retain the cables.

Guides 30 are mounted in vertical alignment to define channel 32 along each side of rack 12. Guides 30 define gaps 33 for cables to exit channel 32. Guides 30 are spaced vertically along posts 13 to define gaps 35 between guides 30 for cables to exit. In the preferred embodiment, there is one arm 44, 46 for each panel 20 in each vertical cable guide. Other vertical cable guides are anticipated for defining the vertical channels along the sides of rack 12. Guides 30 are flipped upside down to populate the other side of the rack.

Referring now to FIGS. 1 and 4–10, fanning tray 16 includes a fanning strip 124 for receiving cables extending in a vertical direction toward fanning tray 16 (as shown in FIG. 1). Fanning strip 124 includes a base 130 with horizontal fingers 134 and spaces 136. A cover 125 is removable from fanning strip 124 to expose an interior 138 of fanning tray 16 which communicates with spaces 136 and open ends or exits 130, 132. Fanning strip 124 includes a horizontal bottom tray 126. Fingers 134 include bend radius limiters 148 snap mounted to a main body 142. At an end of main body 142 of each finger 134 is a downward tab 144 to assist with cable retention. Hinges 140 allow for mounting of fanning tray 16 to rack 12 with fasteners.

Cover 125 includes two apertures 150, 152 for receipt of upper tabs 154, 156 on fanning tray 16. Fingers 158, 160 on cover 125 include latches 162, 164 for releasably latching cover 125 to lower tabs 166, 168 of fanning tray 16. Expandable boss 165 is expanded by flipping latch 162, 164 to the closed position as shown, wherein the boss is held in slot 167 of lower tabs 166, 168. Lips 169 help support cover 125. To further assist with cable radius bend protection, radius limiters 170, 172, 174, and 176 are positioned adjacent to ends 130, 132 to protect cables exiting and entering fanning tray 16 at ends 130, 132. Each limiter 170, 177, 174, 176 further includes a retention tab 177.

Figure 7:
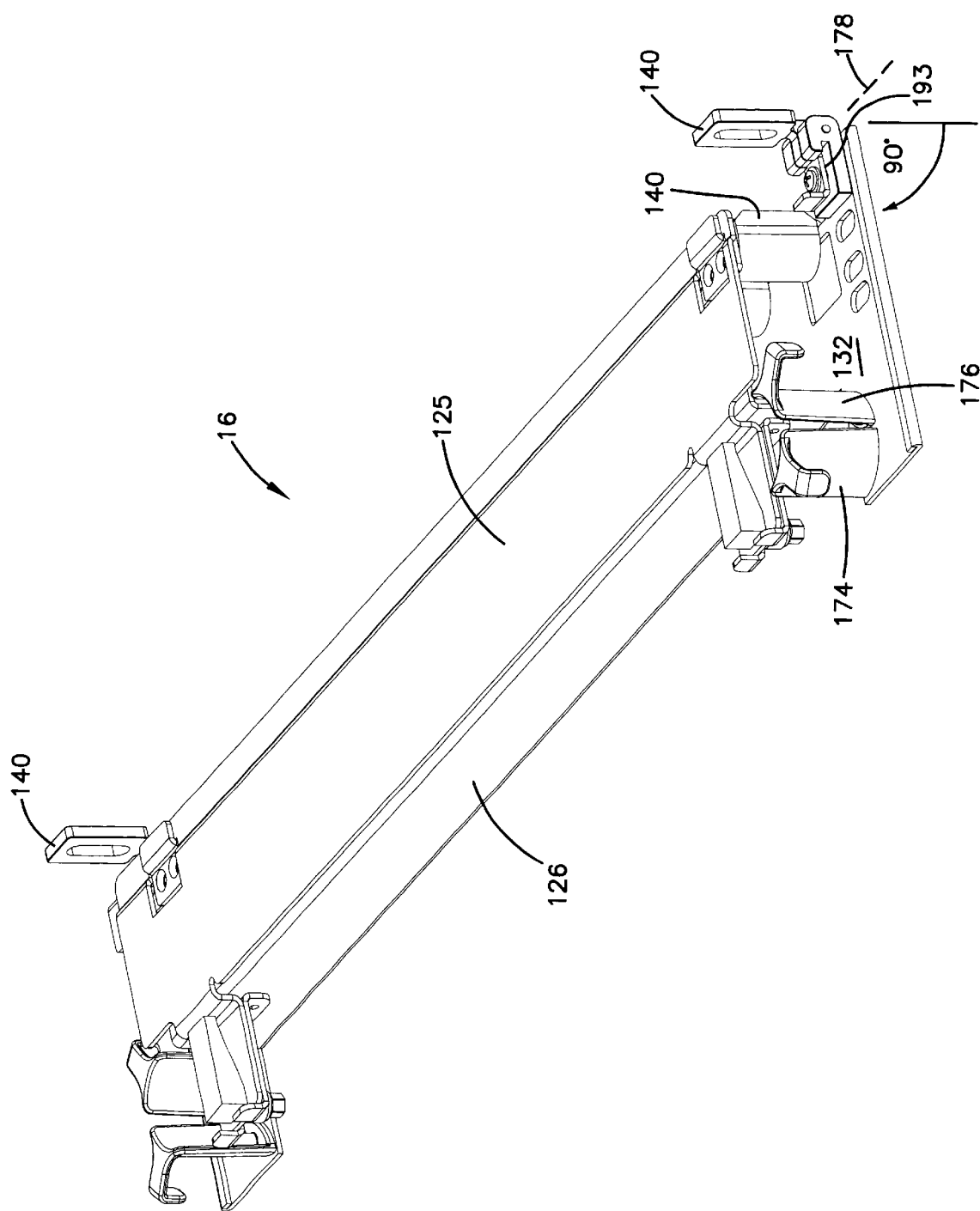
FIG. 7 is a front perspective view of the fanning tray of FIG. 6 locked in the up position.
Figure 8:
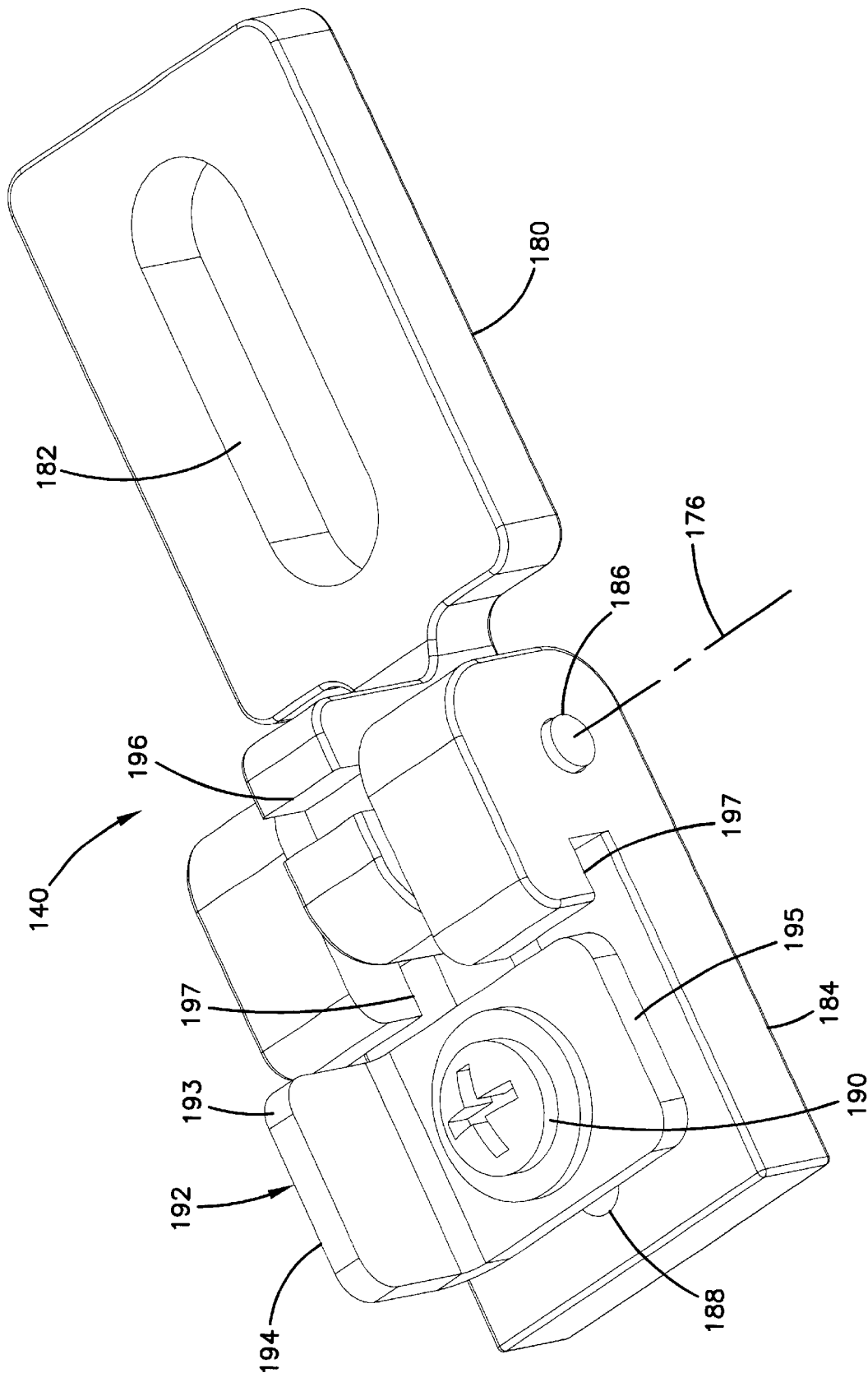
FIG. 8 is a perspective view of one of the hinges for connecting the fanning tray to the rack.
Figure 9:
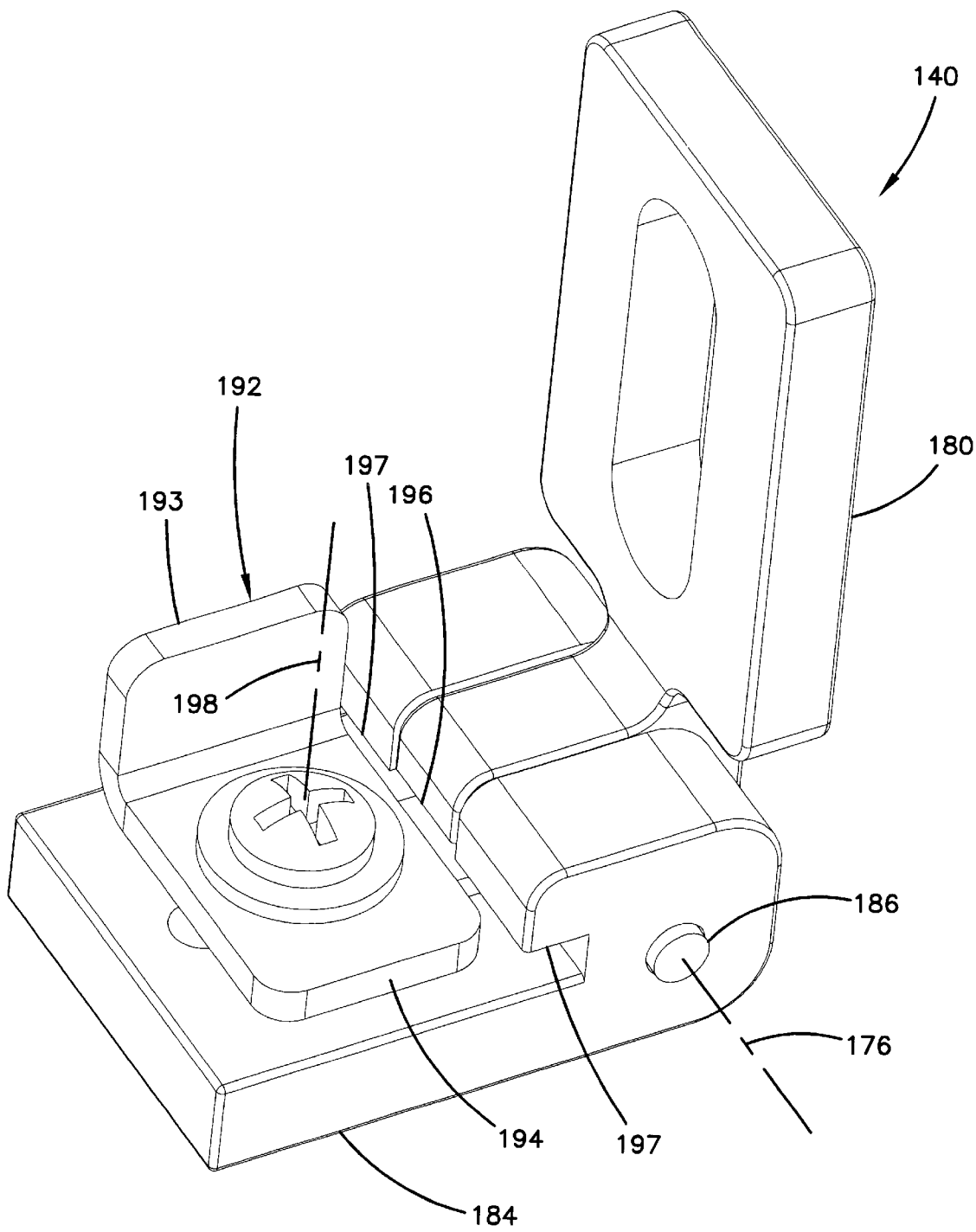
FIG. 9 is a perspective view of the hinge of FIG. 8, shown in the pivoted up position.
Figure 10:
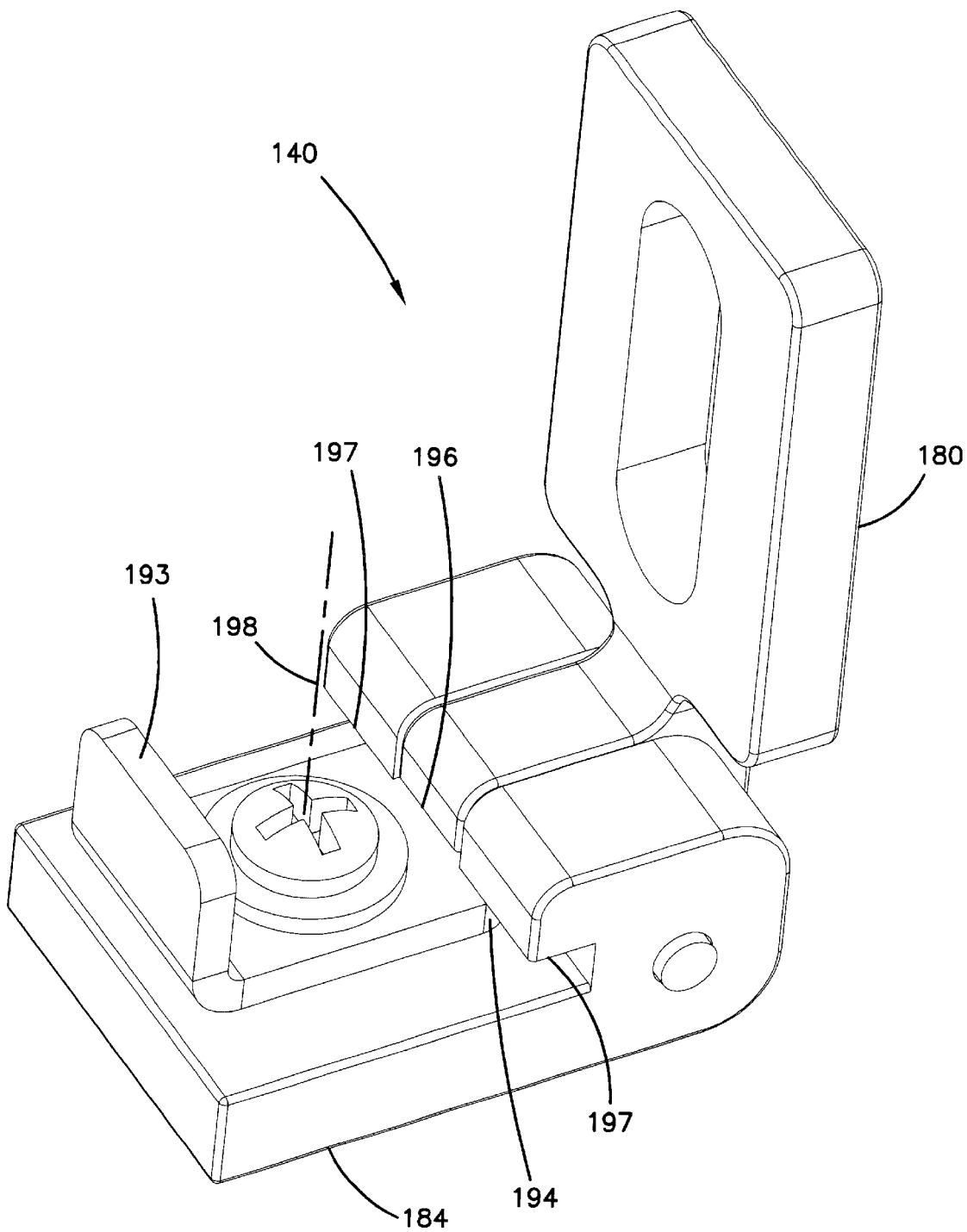
FIG. 10 is a perspective view of the hinge of FIG. 9 locked in the pivoted up position.
Figure 11:
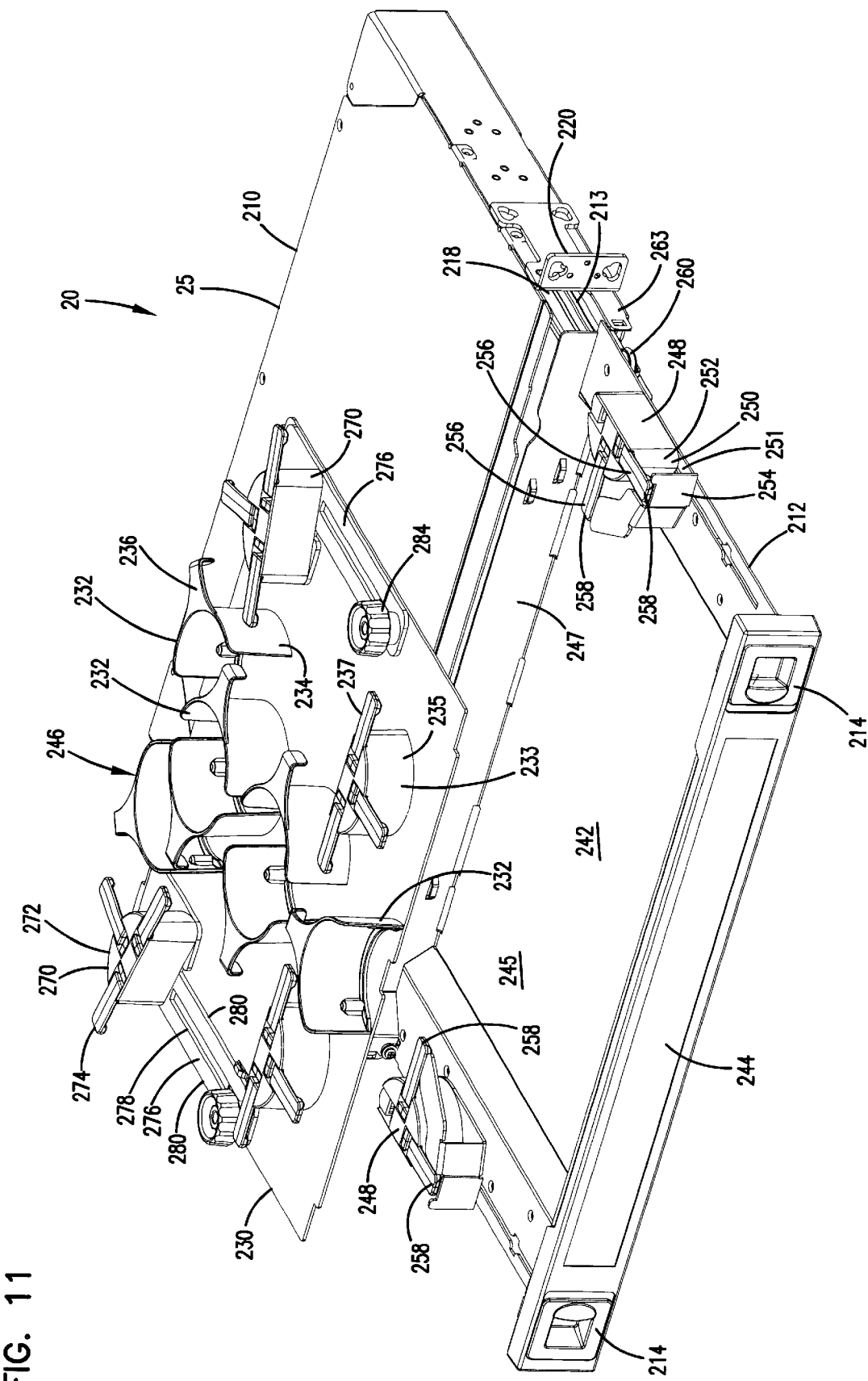
FIG. 11 is a perspective view of a first embodiment of a cable management panel including a chassis and a drawer, with the drawer in the open position, and the tray insert shown exploded from the drawer.
Figure 12:
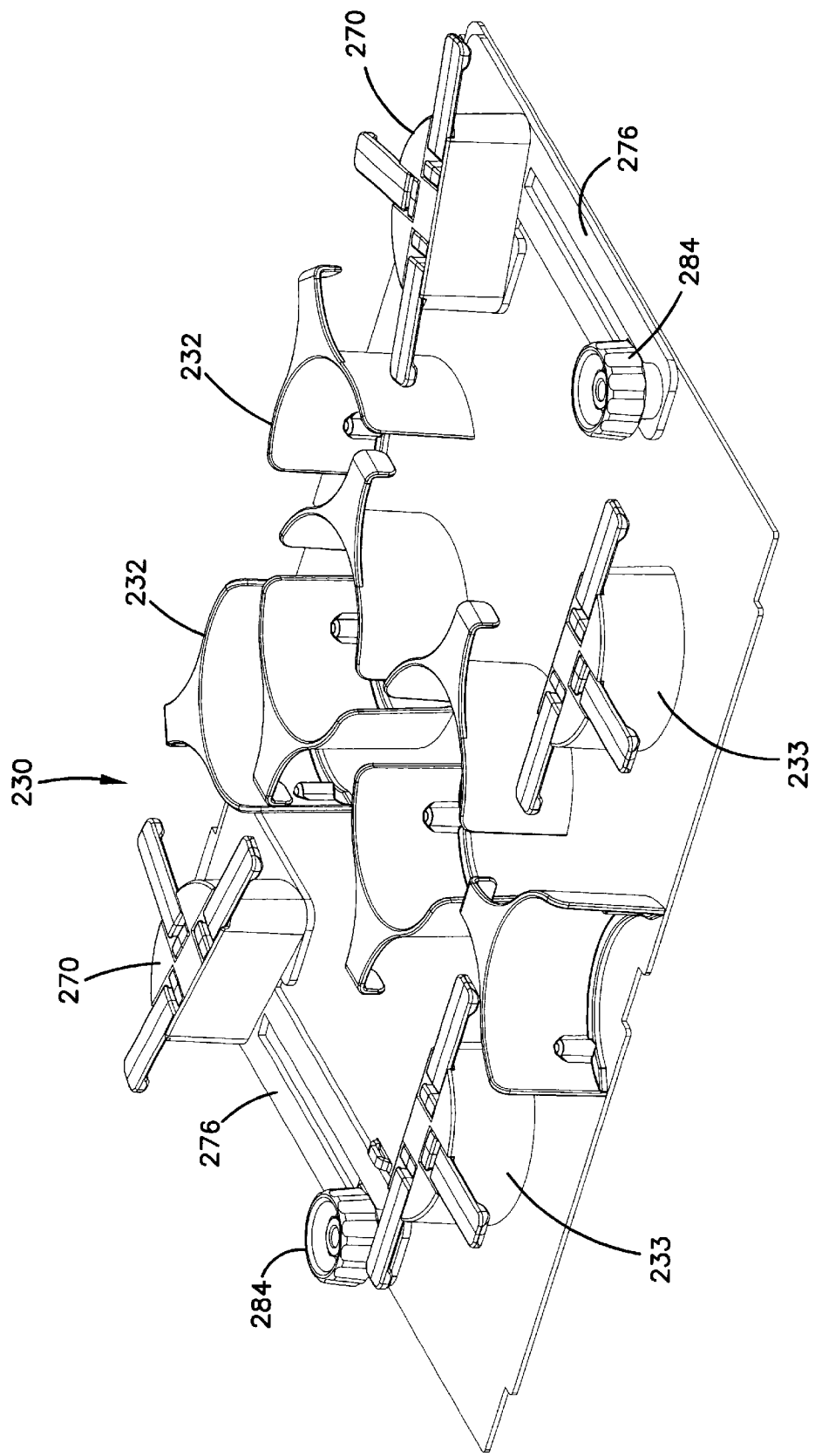
FIG. 12 is a perspective view of the tray insert of FIG. 11.
Figure 13:
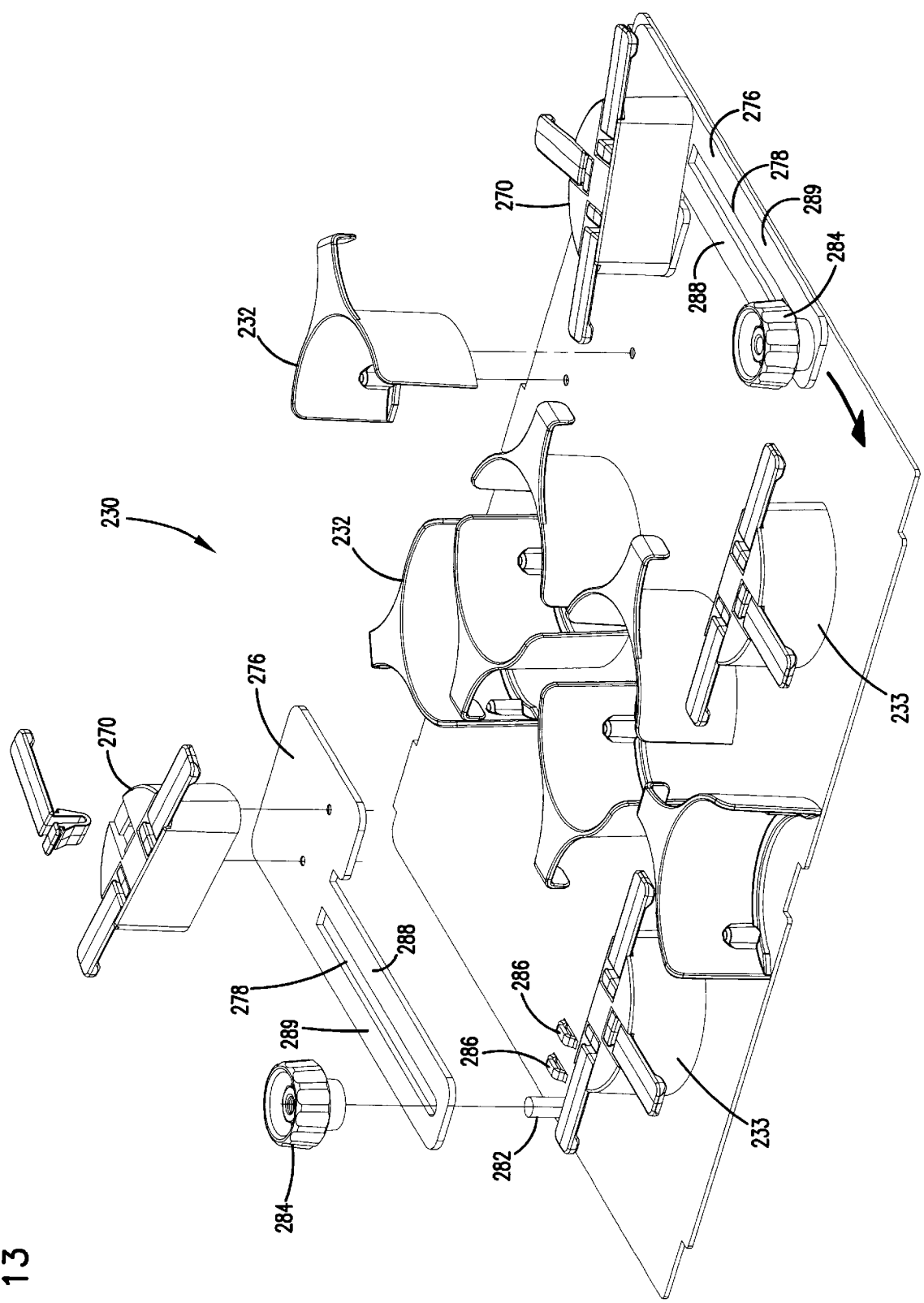
FIG. 13 is an exploded perspective view of the tray insert of FIG. 12.

As shown in FIG. 7, fanning tray 16 pivots upwardly about a hinge axis 178. The pivoted up position is approximately 90 degrees from the vertical axis. Hinges 140 allow for the upward movement of fanning tray 16 so as to allow access by the user to the space behind fanning tray 16 in rack 12. Such space may include rack mounted equipment 27, such as equipment cooling fans, as shown in FIG. 1. Fanning tray 16 is mounted outside the rack space, the space between posts 13, so that the space can be used by additional equipment, such as the cooling fans.

Hinge 140 includes a first portion 180 defining an aperture 182 for receipt of a fastener for mounting hinge 140 to rack 12. A second portion 184 of hinge 140 is hingedly mounted to first portion 180 about hinge axis 176. A hinge pin 186 defines hinge axis 176 linking first portion 180 to second portion 184. Second portion 184 defines an aperture 188 for receipt of a fastener 190 for receipt in opening 192 of fanning tray 16 to mount second portion 184 to fanning tray 16.

Figure 6:
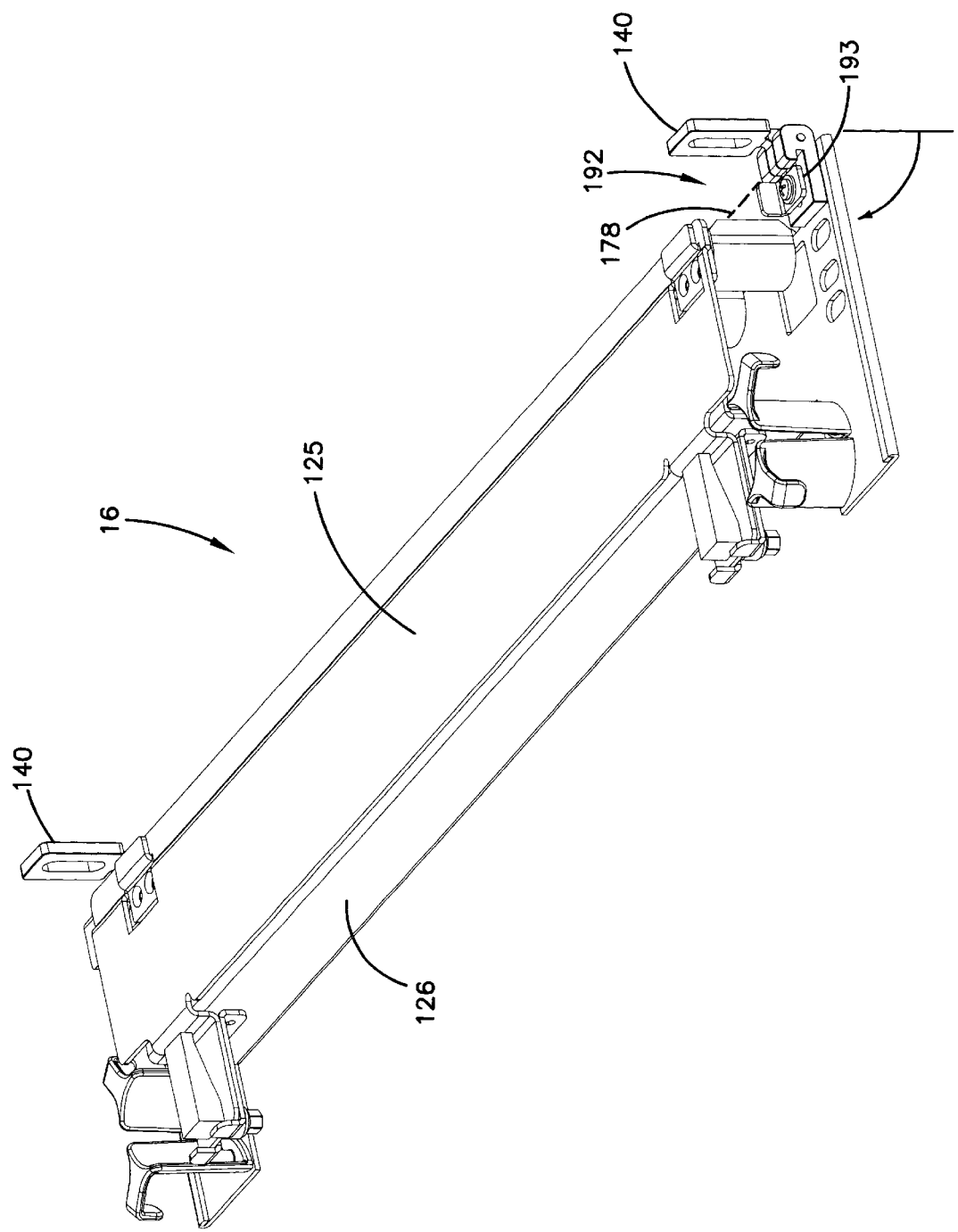
FIG. 6 is a front perspective view of the fanning tray of the system of FIG. 1, with the fanning tray pivoted to the up position.

Fanning tray 16 includes a lock 192 for locking the fanning tray in the pivoted up position as shown in FIGS. 6 and 7. Lock 192 includes a rotating tab 193. Tab 193 includes a handle end 194 and a distal end 195. First portion 180 of hinge 140 includes a slot 196, and second portion includes slots 197. In the pivoted up position (FIG. 6), slots 196, 197 are aligned. Tab 193 can be rotated 90 degrees about an axis 198 from the position of FIGS. 6 and 9, to the position of FIGS. 7 and 10. In the rotated position, distal end 195 of tab 193 is positioned in slots 196, 197. In the rotated position, tab 193 prevents fanning tray 16 from rotating back to the down position. Lock 192 allows for hands-free access to the area behind fanning tray 16. Tab 193 is rotated back to the position of FIGS. 6 and 9 to allow the fanning tray to rotate back to the down position.

Cables 24, 25 from equipment 14 enter fanning tray 16 through spaces 136 and onto interior 138. The cables extend horizontally in bottom tray 126 to exit on either end 130, 132 into vertical cable guides 22. From vertical cable guides 22, the cables enter one of first panels 20 or are directed to another rack. From panel 20 the cables are directed to one of second panels 21. From panels 20 or 21, the cables can be further directed back to equipment 14 or to another rack.

Figure 15:
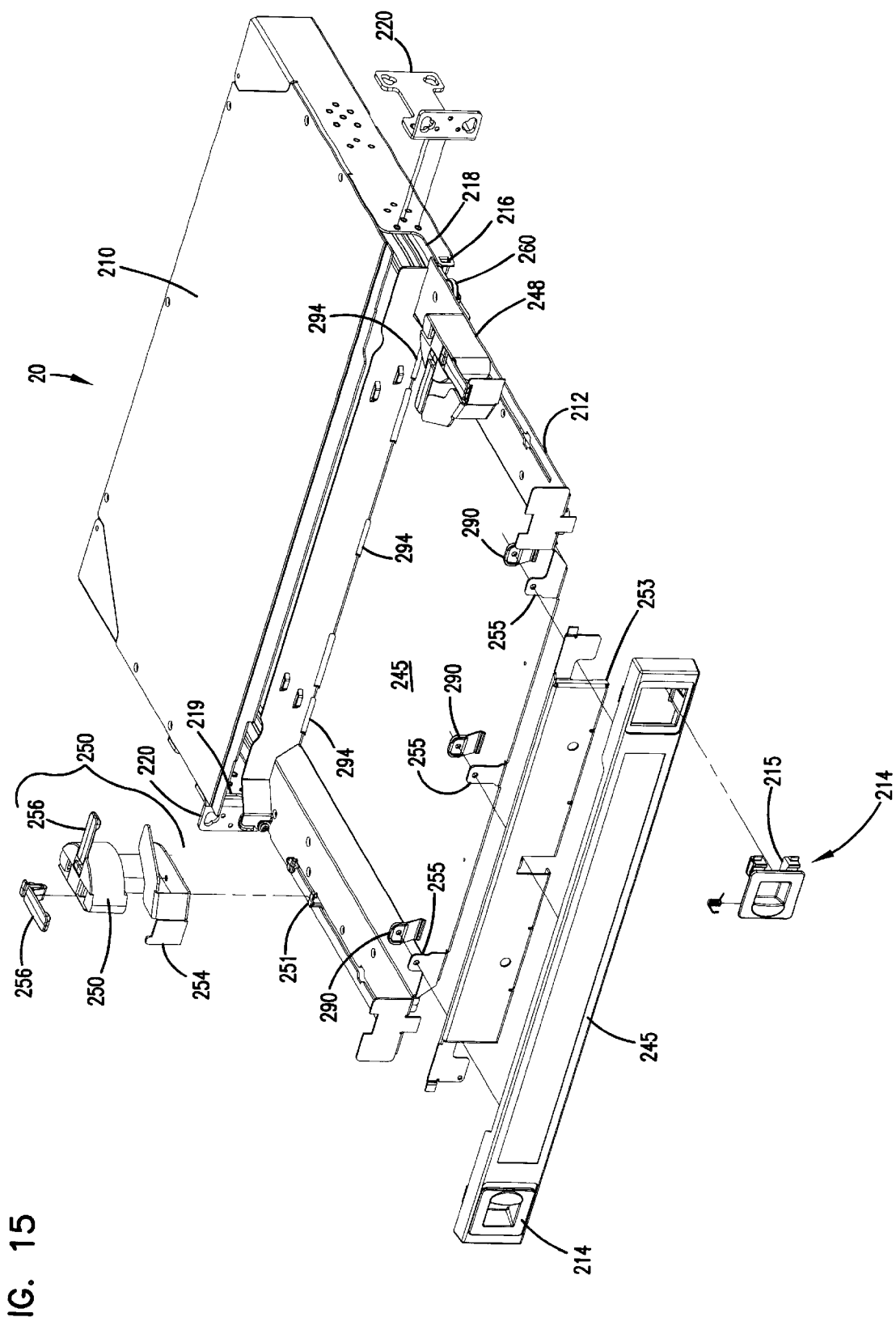
FIG. 15 is an exploded perspective view of the drawer of FIG. 11.
Figure 16:
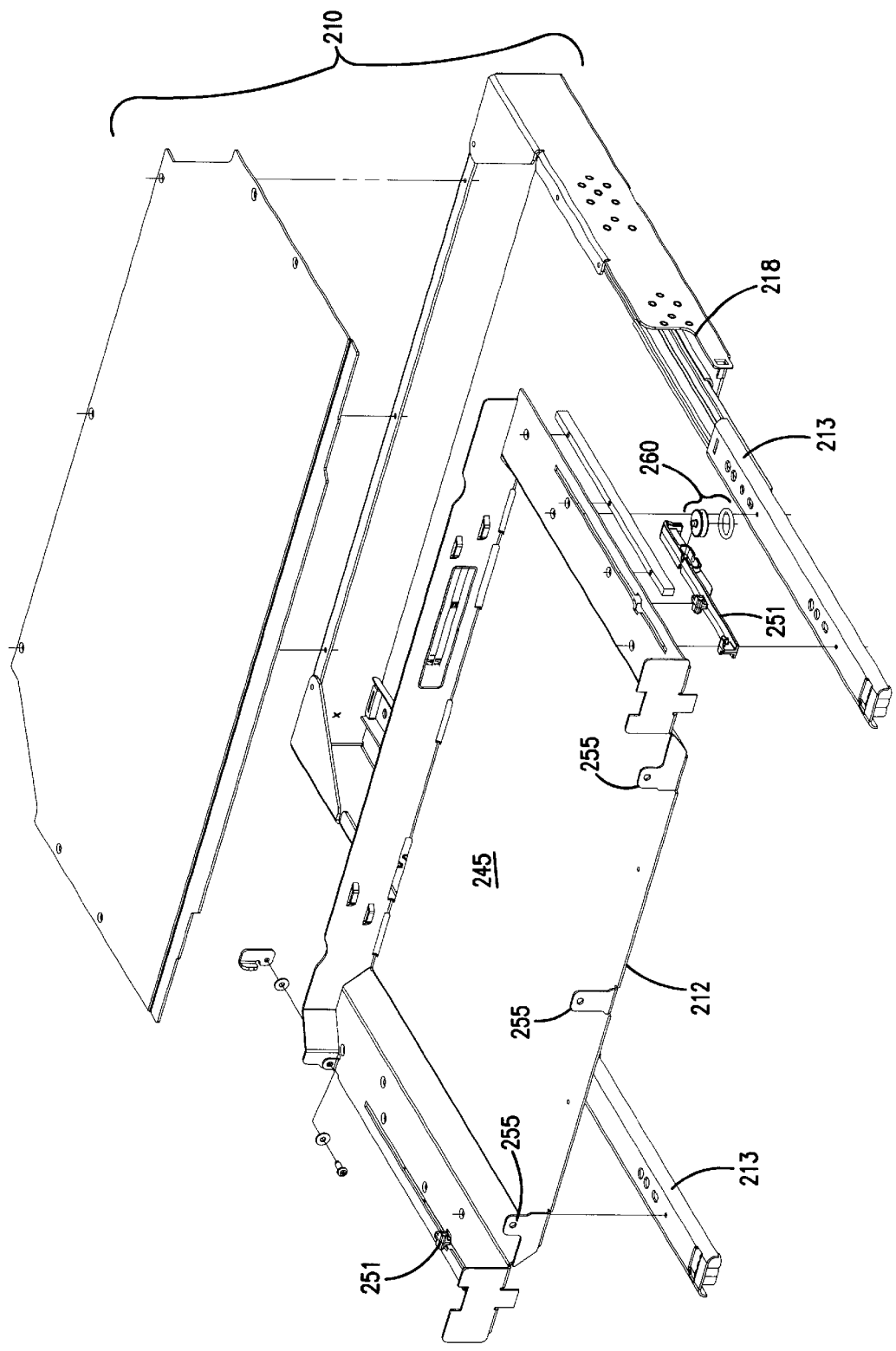
FIG. 16 is a further exploded perspective view of the drawer of FIG. 11.
Figure 17:
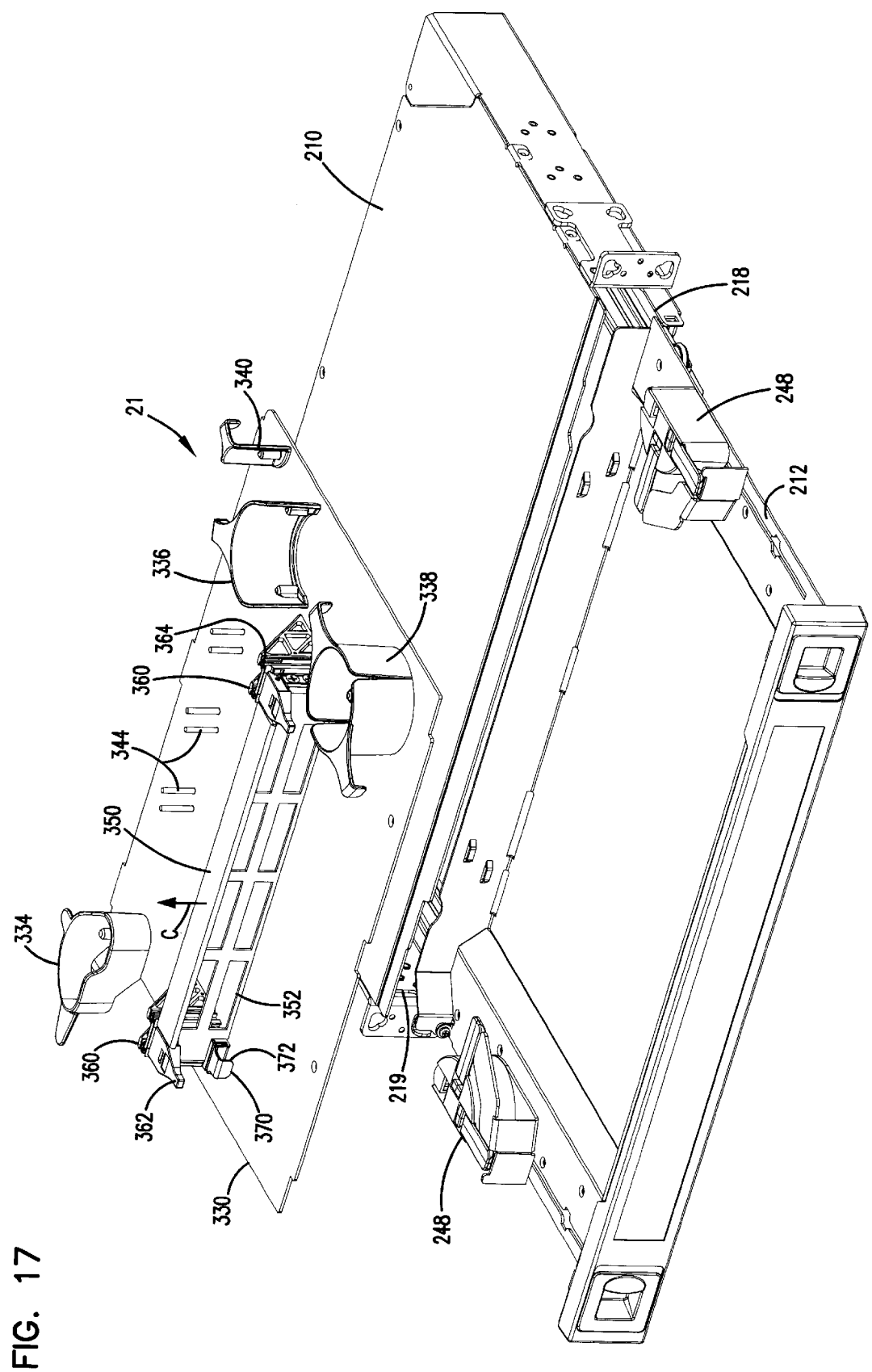
FIG. 17 is a perspective view of a second embodiment of a cable management panel including a chassis and a drawer, with the drawer in the open position, and the tray insert shown exploded from the drawer.
Figure 18:
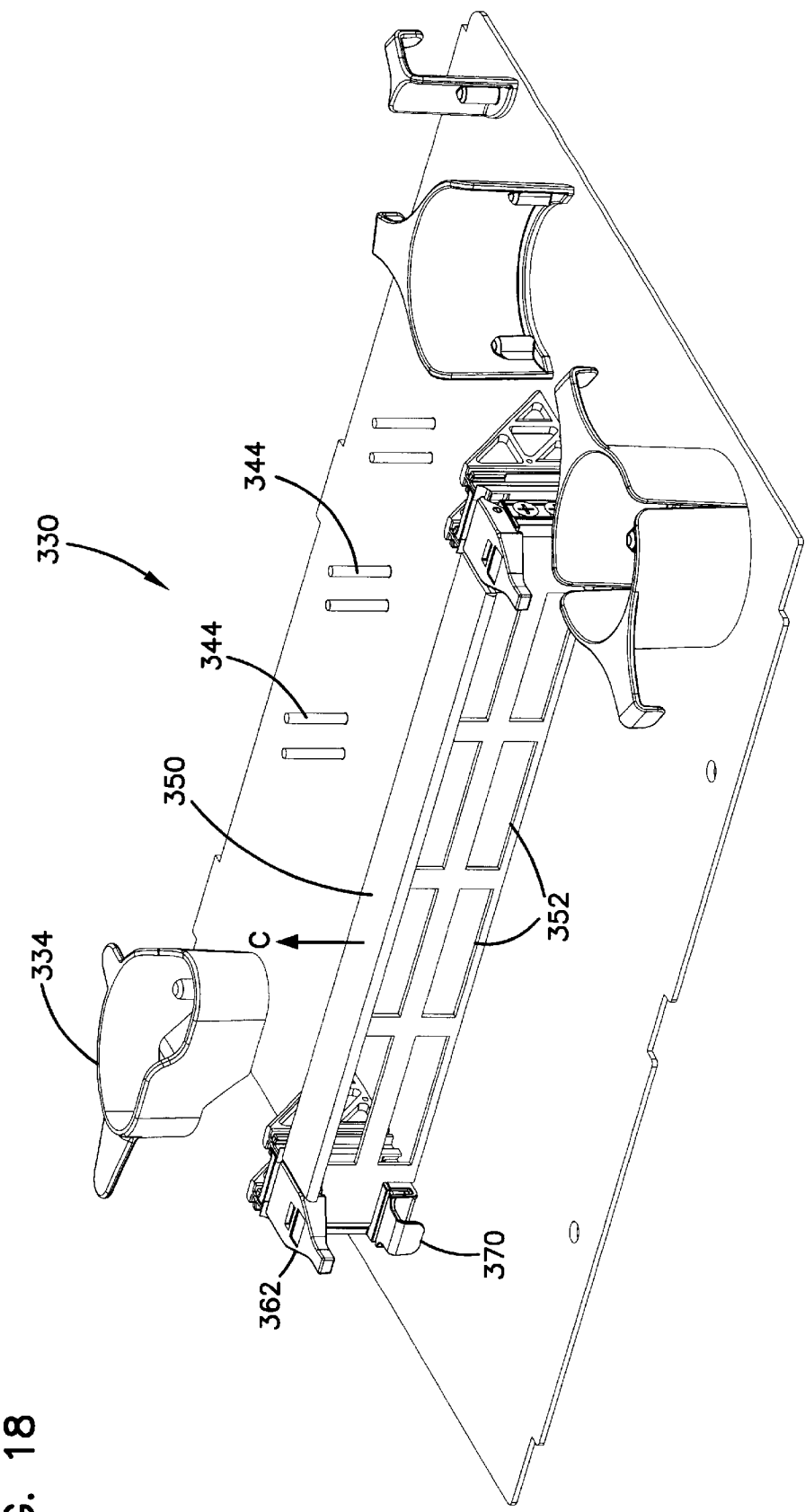
FIG. 18 is a perspective view of the tray insert of FIG. 17.
Figure 19:
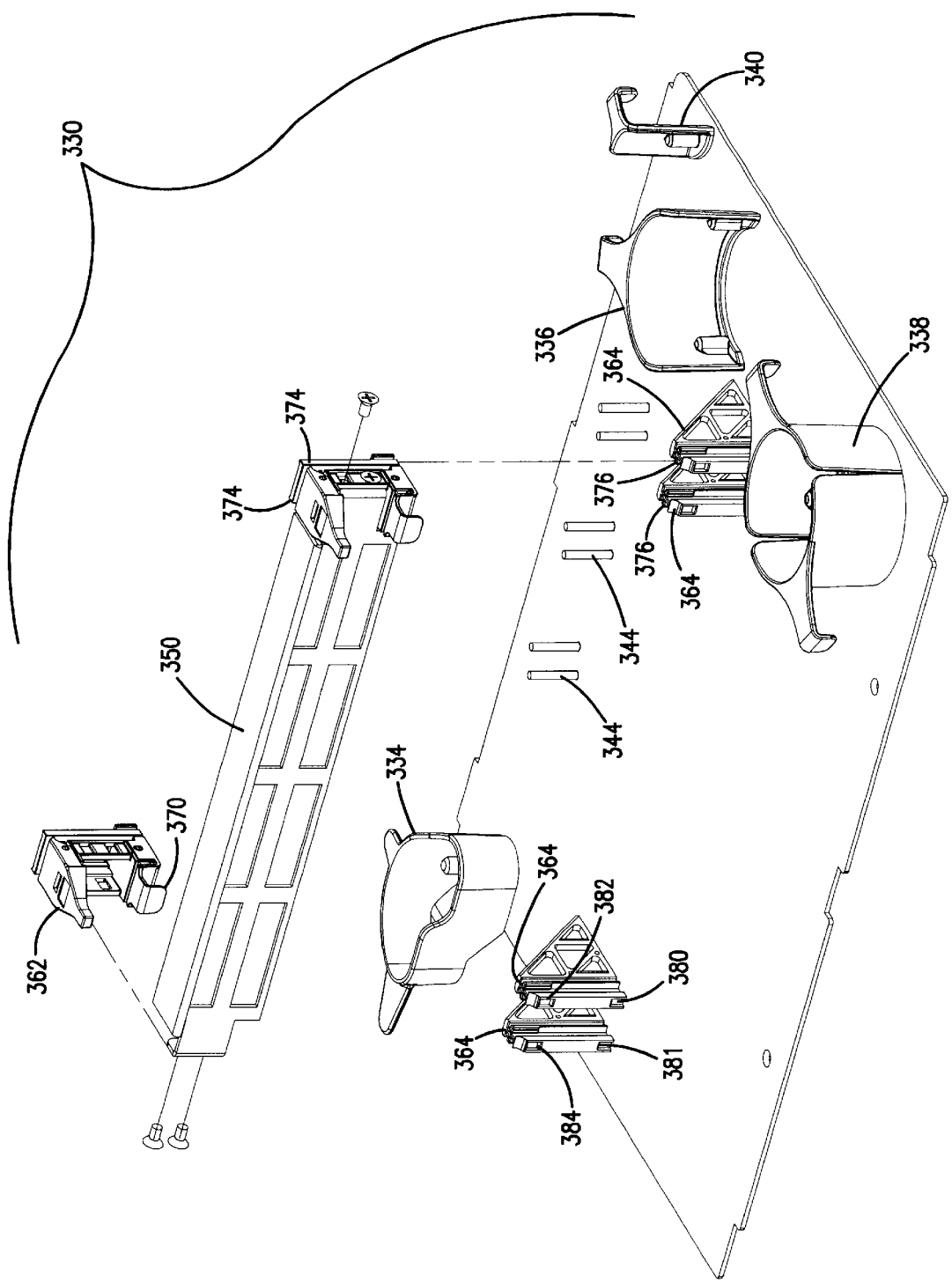
FIG. 19 is an exploded perspective view of the tray insert of FIG. 18.

Panels 20, 21 can be in accordance with any of a variety of structures for storing, managing, or terminating optical fibers. In the preferred embodiment, panels 20, 21 include movable drawers 212 (See FIGS. 15 and 16) which allow for selective opening to expose an interior of the drawer, and for selective closing to protect the drawer's interior. Panels 20, 21 can include structures for cable management as in accordance with copending application Ser. No. 09/900,465, which is incorporated by reference herein. Panels 20, 21 preferably include a cable take-up mechanism 248 for managing the cables entering or exiting panels 20, 21. Cable take-up mechanism 248 operates in a similar manner as in application Ser. No. 09/900,485, to take up slack associated with a sliding drawer.

Panels 20, 21 may include cable management structure, for example, devices for storing the cables or connecting the cables to other cables or fiberoptic devices. Panels 20, 21 may also include attenuators, couplers, switches, wave division multiplexers, splitters or splices. Panel 20 include a chassis 210 with a drawer 212 slidably mounted within chassis 210. Together chassis 210 and drawer 211 define a drawer assembly 25. Drawer 212 is slidable relative to chassis 210 by way of one, preferably two drawer slides 213 on opposite sides of chassis 210. The drawer slides 213 can be any type of linear slide that allows drawer 212 to slide out to the position of FIG. 9, and to then slide horizontally into chassis 210. Each drawer 212 includes two latches 214 to secure the drawer 212 in a closed position. A latch tab 215 engages an aperture 216 in chassis 210 to hold the drawer in the closed position. Panel 20 includes brackets 220 on opposite sides to mount panel 20 to rack 12.

Each drawer 212 includes a base 242, a front wall 244, and a rear wall 246. Note that the drawer 212 is absent of sidewalls, or is "sidewall free." This structure allows for cable entry and exit and prevents cable damage during sliding movement of drawer 212 when accessing the cables and connectors or other devices in drawer 212. Base 242, front wall 244, and rear wall 247 together define a storage interior 245 for holding and storing the cables. Cable access to storage interior 245 is through cable access or entries 218, 219. Front wall 244 includes a front faceplate 245 and a front plate 253 fastened together at front tabs 255 of base 242.

Each storage interior 245 is sized for receiving cable management and/or distribution structures. When the drawer 212 is in the closed position, the cables and management or distribution structures in the storage interior 245 are protected. In preferred embodiments, the distribution structures can be conveniently mounted on a tray insert 230 that drops into storage interior 245. This allows for convenient structuring of the drawer 212 to serve one or more desired functions in the panel 20. Examples of tray inserts are described in co-pending and commonly assigned U.S. patent application Ser. No. 09/649,398, which is a continuation-in-part of application Ser. No. 09/490,379 (also co-pending and commonly assigned), and application Ser. No. 09/900,465, each of which is incorporated by reference herein.

Each drawer 212 includes a take-up mechanism 248 on each side to manage optical fibers entering and exiting panel 20. In the preferred embodiment illustrated, each take-up mechanism 248 includes a push member or radius limiter 250. In the preferred one shown, radius limiter 250 includes a vertically oriented curved wall 252 and a trough section 254 adjacent to the vertically curved wall 252. Cover members 256 help to retain cables in the trough section 254. Ends 258 of cover members 256 pivot upwardly to allow cable access. Radius limiter 250 snap mounts to slide member 251 beneath base 242.

Radius limiter 248 is preferably slidably mounted relative to drawer 212. Movement of radius limiter 248 is controlled with synchronized movement with drawer 212 to insure that the cables do not bend too sharply when the drawer is being opened or closed relative to chassis 210. If the cables were bent too sharply, this may cause of signal strength or loss of transmission. Preferably, the cable management panel 20 includes a control mechanism 260 that is secured to the drawer to synchronize slidable movement of cable radius limiter 250 relative to slidable movement of drawer 212 within chassis 210. In particular, the control mechanism 260 includes a rotating wheel 262 connected to slide member 251. A preferred 262 wheel will include a compressible ring that circumscribes the wheel to help provide for a smooth interface and to introduce some friction for smooth operation. The axis of rotation of wheel 262 is a vertical in the preferred embodiment. When drawer 212 is pushed into chassis 210, wheel 262 rolling by engages a wall 263 which causes radius limiter 250 to move toward the front of the drawer 212. Therefore, as the drawer 212 moves backward, the radius limiter 250 moves forward on the drawer. When drawer 212 is closed cables enter and exit drawer 212 at limiter opening 251, positioned at side access 218 of chassis 210.

Figure 14:
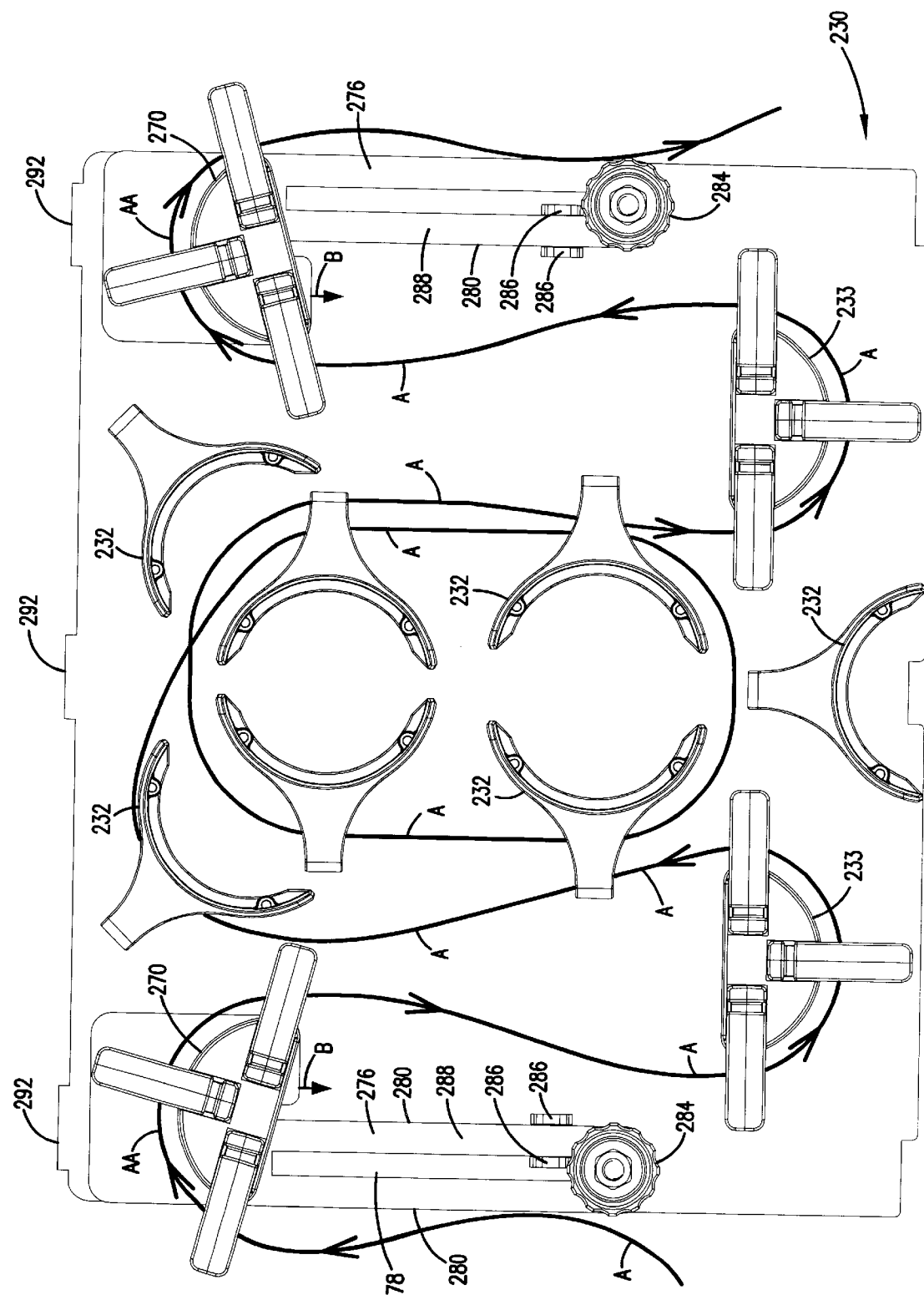
FIG. 14 is a top view of the tray insert of FIG. 12.

Tray insert 230 includes various cable management devices, such as guides 232 including curved walls 234 and cable retention tabs 236 arranged on tray insert 230 to provide for cable management pathways for winding of slack loops of cable that enter drawer 212 through side entries 218, 219 and take up mechanisms 248. Further cable guides 233 including vertical walls 236 and tabs 237 also provide for cable management. Together guides 232, 233 define selectable cable pathways to take up the length of cable so no excess slack hangs out of the drawer. FIG. 14 shows one example cable pathway A on tray insert 230.

In some instances, it is necessary for a user to release some of the stored slack. For example, such release of stored slack is desired when fanning tray 16 is pivoted upwardly. Without release of the slack, there is a possibility of too much cable pull. A further cable radius limiter 270 is slidably mounted to tray insert 230. Cable radius limiter 270 includes an outer curved surface 272, and cable retention tabs 274. An elongated slide 276 extends from cable radius limiter 270 and includes an inner slot 278 between elongated arms 288, 289 and opposed outer edges 280. Tray insert 230 includes a threaded shaft 282 projecting upwardly and received in slot 278. A threaded wheel 284 mounts to threaded shaft 282 to selectively lock cable radius limiter 270 in position. Slide 276 and cable radius limiter 270 are held in place through a clamping force generated by threaded wheel 284 on slide 276. Once threaded wheel 284 is loosened, cable radius limiter 270 through slide 276 can slide toward the front edge of the drawer insert 230 as desired, such as to selectively release the slack held by cable radius limiter 270. Two tabs 286 capture elongated arm 288 of slide 276 to guide slide 276 linearly. One tab 286 engages one of outer edges 280, and the other tab 286 is positioned in slot 278. By sliding cable radius limiters 270 in the direction of arrow B, slack loops AA are released (See FIG. 14). Tray insert 230 is held in drawer 212 by latches 290 mounted to front tabs 255. Rear tabs 292 of tray insert 230 fit into rear slots 294 of drawer 212 to further retain tray insert 230.

Referring now to FIGS. 17–24, second panel 21 with a tray insert 330 is shown. Various cable guides 334, 336, 338, and 340 are positioned around drawer insert 330 for defining various cable pathways. Cable fanout mounts 344 are also provided on drawer insert 330. Fanout mounts 344 allow for multi-fiber cables to fan out into individual fibers, such as for termination at a panel 350. Panel 350 can hold fiber optic adapters 349 received in openings 352. Each adapter receives one or more fiberoptic connectors on opposite sides of the adapter. Any type of mating adapter/connector system can be used, such as MU adapter/connector types.

To facilitate accessibility, panel 350 is slidably mounted to tray insert 330 through slide module 360. Each slide module 360 is modular and includes a pivoting handle 362. Handles 362 allow for release of panel 350 from a locked position to slide upwardly on slide walls 364. Slide handle 370 retains panel 350 with slide walls 364. Slide handle 370 is spring loaded to resist movement of handle portion 372 away from slide wall 364. Slide handle 370 can be moved manually to allow panel 350 to be removed from slide walls 364, such as for repair or replacement. A groove and rail arrangement allows for vertical sliding of panel 350 and slide modules 360. Grooves 376 on slide walls 364 receive rails 374 on slide module 360.

In use, both handles 362 are pivoted upwardly to withdraw tab 378 of slide handles 370 from lower notch 380. Handles include end 365 which pulls slide module 360 upwardly. Lower notch 380 includes an upper ramp surface 381 which allows tab 378 to be withdrawn against the spring (not shown) of slide handle 370. Panel 350 is slid upwardly in the direction of arrow C (see FIG. 18). In the upper position, panel 350 and its termination locations are more easily accessed, for making corrections or disconnecting connectors from adapters (See FIG. 22). Panel 350 remains in the upper position when tabs 378 reside in upper notches 382. Notch 382 has a lower ramp surface 384 to withdraw tab 378, to allow downwardly sliding by downward pushing on panel 350 and/or slide modules 360.

Figure 20:
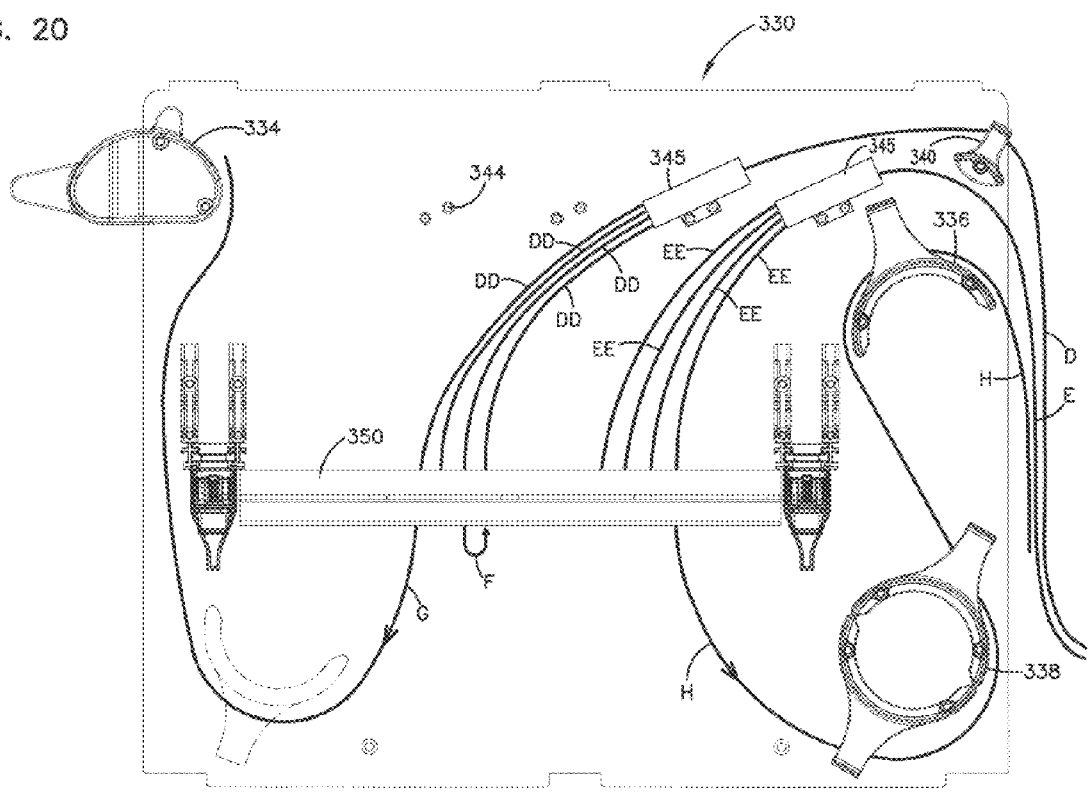
FIG. 20 is a top view of the tray insert of FIG. 18.
Figure 21:
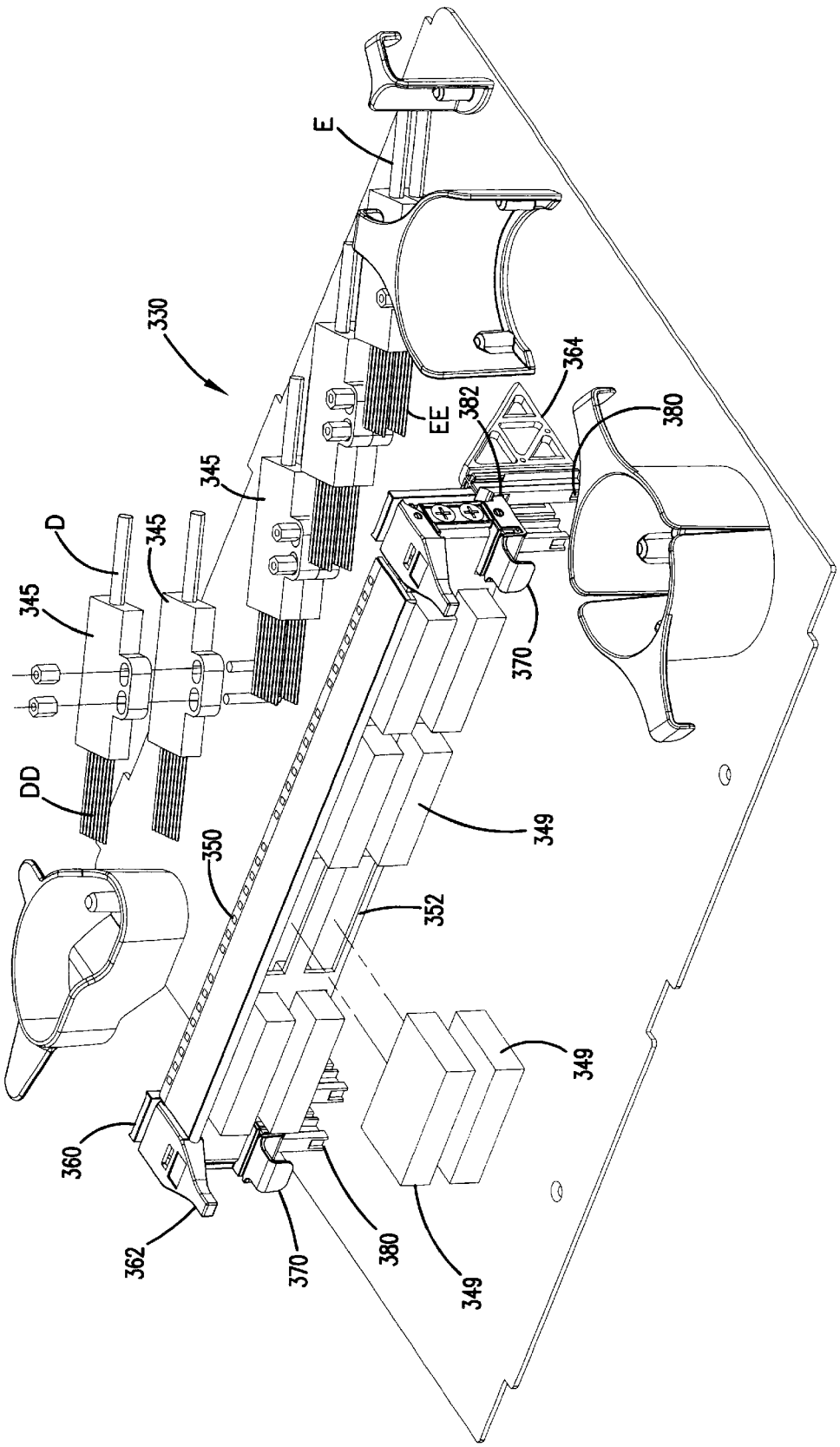
FIG. 21 is a perspective view of the tray insert of FIG. 18 with the termination panel in the upper position; adapters are shown in the termination panel, and fanouts are shown in the fanout mounts.
Figure 22:
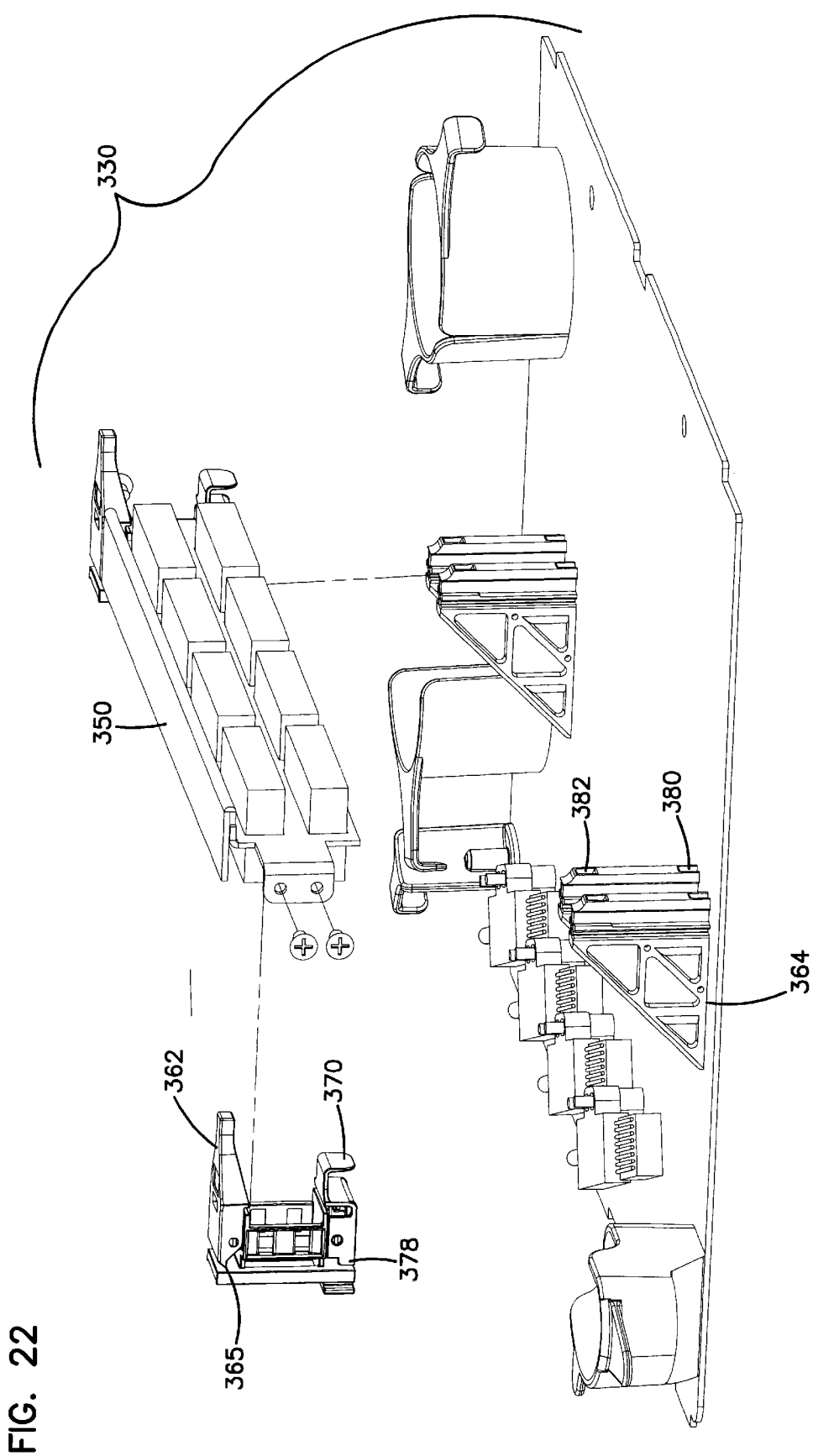
FIG. 22 is a rear perspective view of the tray insert of FIG. 21 with portions exploded.
Figure 23:
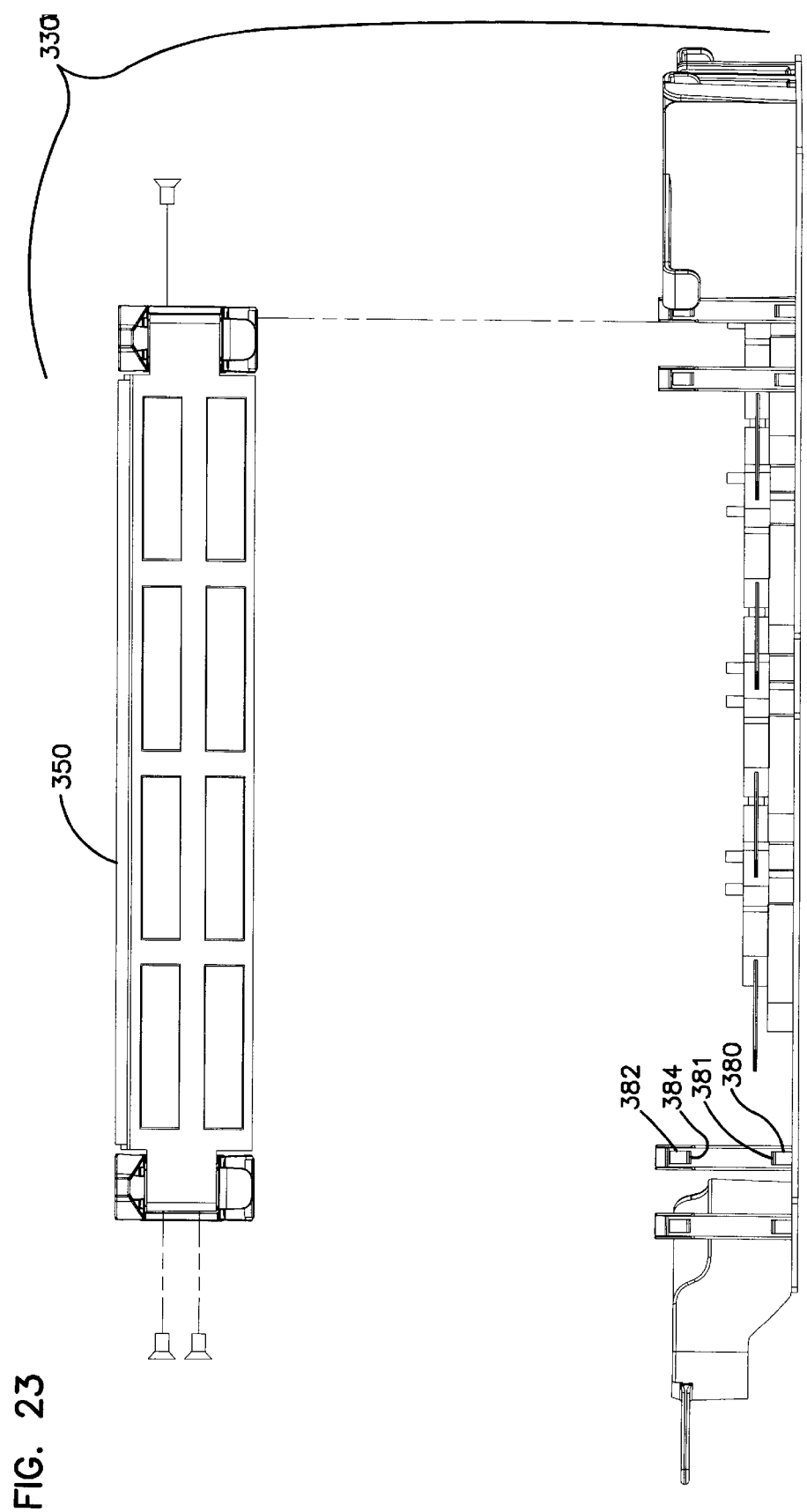
FIG. 23 is a front elevational of the tray insert of FIG. 21 with portions exploded.
Figure 24:
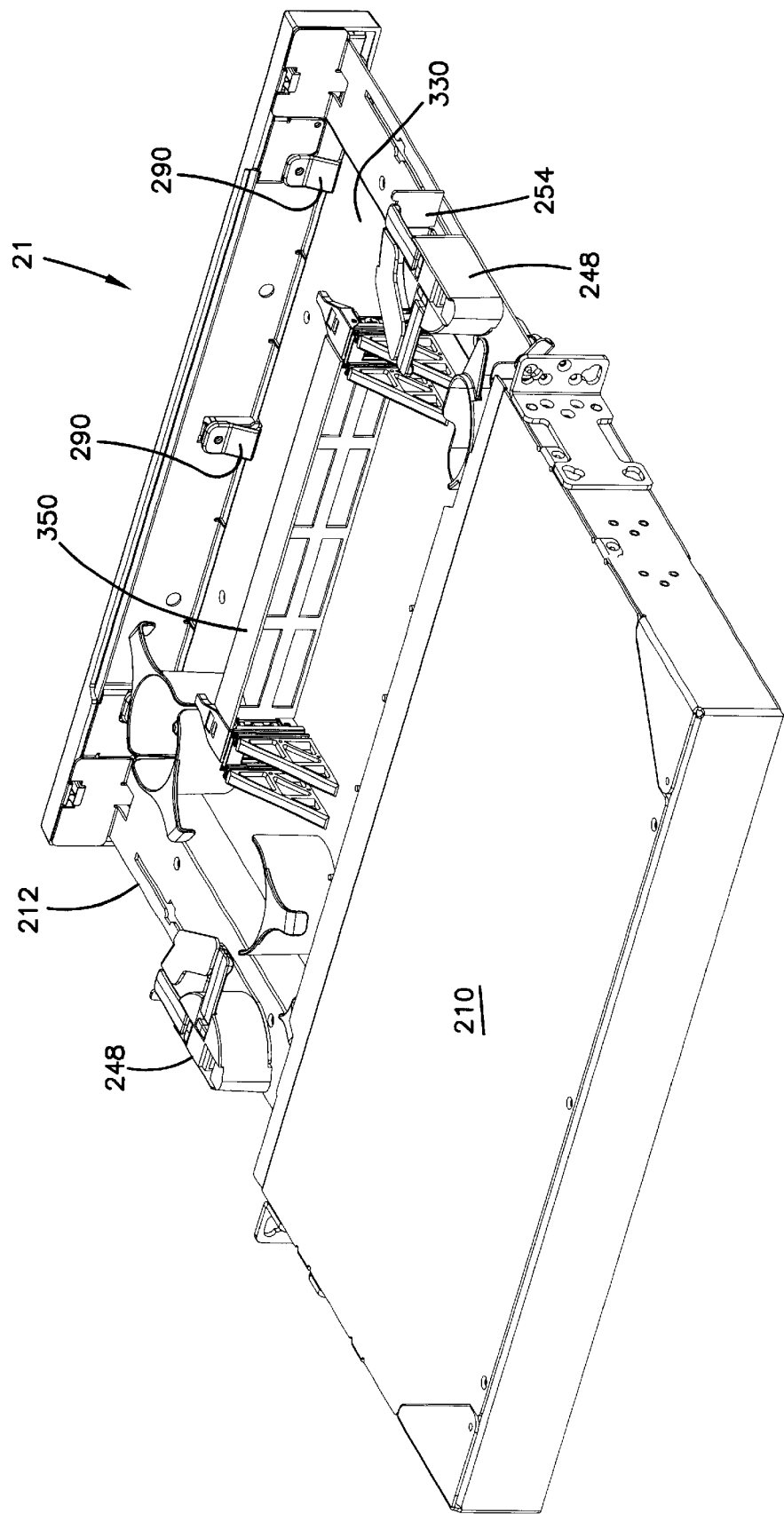
FIG. 24 is a rear perspective of the panel of FIG. 17 with the tray insert positioned in the drawer.

FIG. 20 shows an example cabling for tray insert 330. Cables D and E enter drawer 21 at side entry 218 (when the drawer is closed), pass through cable radius limiter 248 on the right side and terminate at panel 350. In the example, multi-fiber cables D, E are used. The cables D, E fan out at fanouts 345 into individual cables DD, EE. Cables DD and EE each include connectorized ends for mating with an adapter. From panel 350, jumper cables F can be used to connect cables DD to EE, or DD to DD. Alternatively cables G can be used to exit drawer 212 on an opposite side entry 219. Further cables H can be used to exit at side entry 218.

Figure 25:
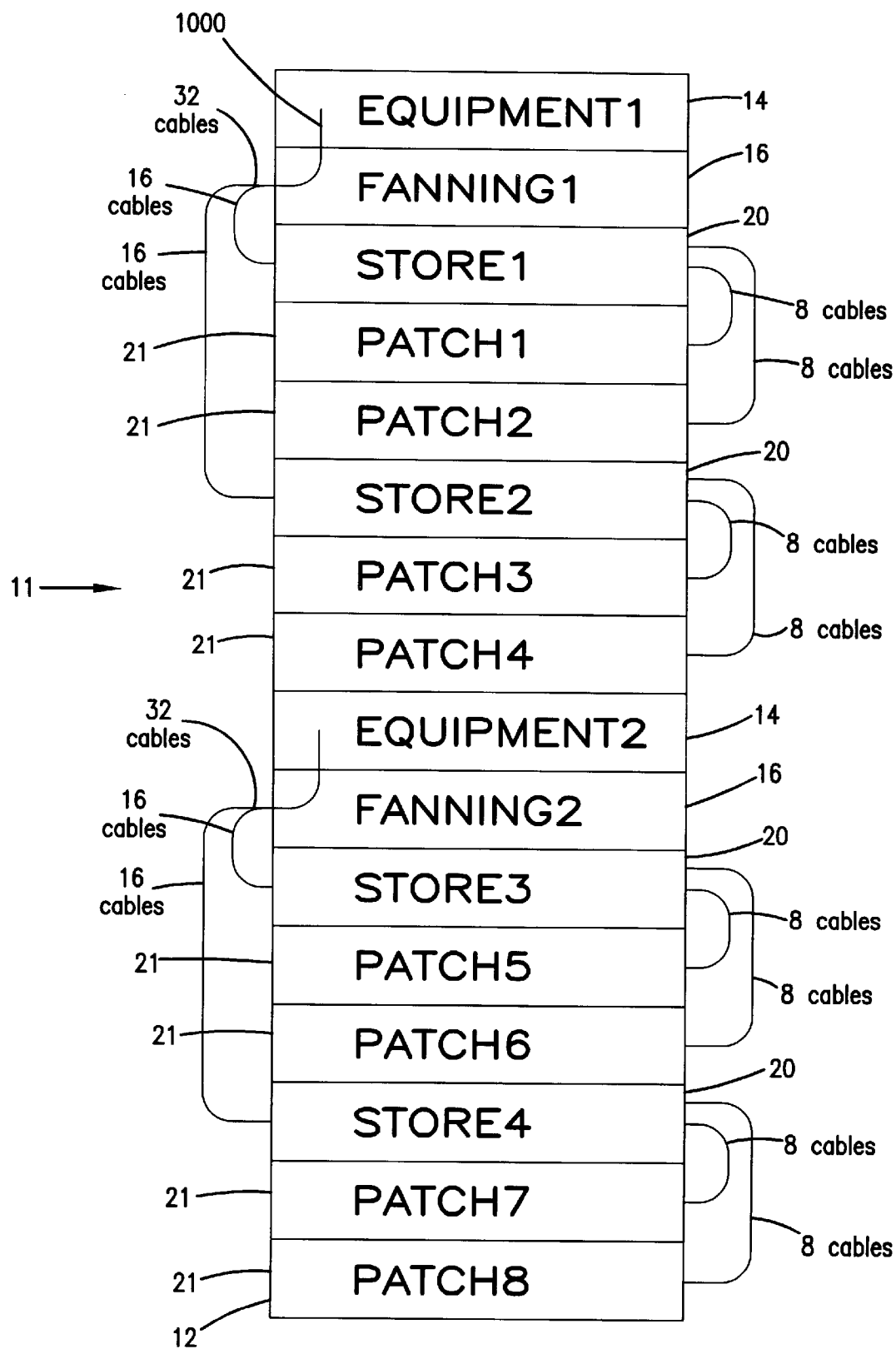
FIG. 25 is a schematic drawing of a telecommunications system showing various cables.

FIG. 25 shows a schematic system 11 where rack 12 holds equipment 14, fanning trays 16, storage panels 20, and patching drawers 21. Multifiber cables 1000, (32 in number for example) extend from equipment 14, labeled EQUIPMENT1, to fanning tray 16 labeled FANNING1. From fanning tray 16, sixteen cables extend into one storage panel 20, labeled STORE1, and sixteen extend into another storage panel 20, labeled STORE2.

From storage panel 20 labeled STORE1, eight cables extend into patching drawer 21, labeled PATCH1. Eight more cables extend from storage drawer 20 labeled STORE1 to patching panel 21, labeled PATCH2. A similar arrangement is with respect to the second storage panel 20, labeled STORE2, and the two patching panels 21, labeled PATCH3 and PATCH4. Within the patching panels 21, the individual cables are connected to each other with jumper cables like cables F shown in FIG. 20. Each jumper cable has two connectorized ends for mating with the adapters. Rack 12 is sufficiently large such that a second area of equipment, labeled EQUIPMENT2, can be provided along with the fanning tray 16, and storage and patching panels 20, 21.

The above specification, examples, and data provide a complete description of the manufacture and use of the composition of the invention. Since many embodiments of the invention can be made without departing from the spirit and scope of the invention, the invention resides in the claims hereinafter appended.

What is claimed is:

1. A cable fanning tray comprising:
   (a) a body having first and second ends extending in a longitudinal direction and having a top and an opposite bottom;
   (b) the top including a plurality of spaced apart fingers, spaced in the longitudinal direction;
   (c) the bottom including a cable tray extending in the longitudinal direction;
   (d) the first and second ends communicating with the cable tray;
   (e) first and second hinges at the first and second ends, respectively, of the body for hingedly mounting the body to a telecommunications rack, wherein the body rotates between a vertical position wherein the top is above the bottom, and a rotated position wherein the top and the bottom are generally horizontal;
   (f) a selectable lock for selectively holding the body in the rotated position.

2. The fanning tray of claim 1, wherein the body defines an open longitudinal channel between the fingers and the cable tray, and further comprising a cover releasably mounted to the body for selectively closing the longitudinal channel.

3. The fanning tray of claim 2, further comprising a radius limiter at each of the first and second ends disposed adjacent to the bottom of the body and positioned below the cable tray.

4. The fanning tray of claim 1, further comprising a slideably mounted cable radius limiter, and a releasable lock for selectively locking the cable radius limiter.

5. The system of claim 1, further comprising fanout mounts or holding cable fanouts.

6. A cable fanning tray comprising:
   (a) a body having first and second ends extending in a longitudinal direction and having a top and an opposite bottom;
   (b) the top including a plurality of spaced apart fingers, spaced in the longitudinal direction;
   (c) the bottom including a cable tray extending in the longitudinal direction;
   (d) the first and second ends communicating with the cable tray;
   (e) first and second hinges at the first and second ends, respectively, of the body for hingedly mounting the body to a telecommunications rack, wherein the body rotates between a vertical position wherein the top is above the bottom, and a rotated position wherein the top and the bottom are generally horizontal;
   (f) wherein the body defines an open longitudinal channel between the fingers and the cable tray, and further comprising a cover releasably mounted to the body,for selectively closing the longitudinal channel;
   (g) a radius limiter at each of the first and second ends disposed adjacent to the bottom of the body and positioned below the cable tray.

7. A telecommunications system comprising:
   (a) a rack defining two vertical posts and a spacing between the posts;
   (b) a cable fanning tray including:
      (1) a body having first and second ends extending in a longitudinal direction;
      (2) the body including a plurality of spaced apart fingers, spaced in the longitudinal direction;
      (3) first and second hinges at the first and second ends, respectively, of the body for hingedly mounting the body to a telecommunications rack, wherein the body rotates between a vertical position and a rotated position wherein an axis of rotation is defined parallel to the longitudinal direction;
   (c) a first optical fiber cable management panel including:
      (1) a drawer assembly including a chassis and a drawer;
         (A) the drawer being slidably mounted within the chassis;
         (B) the drawer assembly defining a storage interior and a first cable access entry to permit optical fiber cable to enter into the storage interior;
      (2) a cable radius limiter slidably mounted to the drawer assembly;
      (3) a releasable lock for selective locking of the cable radius limiter from sliding movement;
   (d) a second optical fiber cable management panel including:
      (1) a drawer assembly including a chassis and a drawer;
         (A) the drawer being slidably mounted within the chassis;
         (B) the drawer assembly defining a storage interior and a first cable access entry to permit optical fiber cable to enter into the storage interior;
      (2) a termination panel positioned in the storage interior, the termination panel slidably mounted between the drawer and the termination panel wherein the termination panel slides vertically in a direction transverse to the direction of sliding movement of the drawer relative to the chassis, the termination panel defining a planar termination area and first and second opposite ends;
      (3) the slidable mount between the drawer and the termination panel including first and second slide modules at the first and second ends of the termination panel.

8. The system of claim 7, wherein each of the first and second optical fiber cable management panels further comprises:
   (a) a side entry cable radius limiter slidably mounted relative to the drawer assembly; and
   (b) a control mechanism secured to said drawer assembly to synchronize slidable movement of the side entry cable radius limiter relative to slidable movement of the drawer within the chassis.

9. The system of claim 8, wherein:
   (a) the control mechanism includes a rotating member oriented to rotate between the drawer and said chassis;
   (b) the rotating member has an axis of rotation that is normal to the cable radius limiter.

* * * * *

UNITED STATES PATENT AND TRADEMARK OFFICE
CERTIFICATE OF CORRECTION

PATENT NO. : 6,677,520 B1  Page 1 of 1
DATED : January 13, 2004
INVENTOR(S) : Kim et al.

It is certified that error appears in the above-identified patent and that said Letters Patent is hereby corrected as shown below:

Column 9,
Lines 13-14, "claim 1, further comprising fanout mounts or holding cable" should read -- claim 7, further comprising fanout mounts for holding cable --
Line 33, "mounted to the body,for" should read -- mounted to the body for --

Signed and Sealed this

Twenty-fifth Day of May, 2004

JON W. DUDAS
*Acting Director of the United States Patent and Trademark Office*